(12) United States Patent
Yamazaki et al.

(10) Patent No.: US 12,384,941 B2
(45) Date of Patent: Aug. 12, 2025

(54) CURABLE SILICONE COMPOSITION, CURED PRODUCT OF SAME, AND METHOD FOR MANUFACTURING SAME

(71) Applicant: DOW TORAY CO., LTD., Tokyo (JP)

(72) Inventors: Ryosuke Yamazaki, Ichihara (JP); Kouichi Ozaki, Ichihara (JP); Toru Imaizumi, Ichihara (JP); Masayuki Hayashi, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 993 days.

(21) Appl. No.: 17/442,656

(22) PCT Filed: Mar. 18, 2020

(86) PCT No.: PCT/JP2020/012027
§ 371 (c)(1),
(2) Date: Sep. 24, 2021

(87) PCT Pub. No.: WO2020/203304
PCT Pub. Date: Oct. 8, 2020

(65) Prior Publication Data
US 2022/0169894 A1 Jun. 2, 2022

(30) Foreign Application Priority Data

Mar. 29, 2019 (JP) .................... 2019-066558
Dec. 27, 2019 (JP) .................... 2019-237945

(51) Int. Cl.
*C09J 7/35* (2018.01)
*B29C 45/00* (2006.01)
(Continued)

(52) U.S. Cl.
CPC ............. *C09J 7/35* (2018.01); *B29C 45/0001* (2013.01); *C08L 83/04* (2013.01); *C09J 183/04* (2013.01);
(Continued)

(58) Field of Classification Search
CPC ........ C09J 7/35; C09J 183/04; C09J 2483/00; C09J 2203/326; C09J 2301/408;
(Continued)

(56) References Cited

U.S. PATENT DOCUMENTS 5,100,976 A  3/1992  Hamada et al.
5,145,886 A  9/1992  Oxman et al.
(Continued)

FOREIGN PATENT DOCUMENTS

AU    618818 B2    1/1992
CN   101151328 A    3/2008
(Continued)

OTHER PUBLICATIONS

International Search Report for PCT/JP2020/012027 dated Jun. 9, 2020, 3 pages.
(Continued)

*Primary Examiner* — Michael B Nelson
(74) *Attorney, Agent, or Firm* — WARNER NORCROSS + JUDD LLP

(57) ABSTRACT

Provided is a curable silicone composition and applications thereof. The curable silicone composition has hot-melt properties, excellent workability, and curing characteristics such as overmolding, and a cured product obtained therefrom does not become hard or brittle, even if left at a temperature of 150° C. or higher for a long time. The curable silicone composition comprises: an organopolysiloxane resin component which is non-hot-meltable, comprises a siloxane unit represented by $SiO_{4/2}$ making up at least 20 mol % or more of the total siloxane units, and has a mass loss of 2.0 mass % or less when exposed to 200° C. for 1 hour; a liquid straight-chain or branched chain organopolysiloxane; and a curing agent.

15 Claims, 1 Drawing Sheet

(51) Int. Cl.
  *C08L 83/04* (2006.01)
  *C09J 183/04* (2006.01)
  *B29K 83/00* (2006.01)
  *H10H 20/851* (2025.01)
  *H10H 20/854* (2025.01)

(52) U.S. Cl.
  CPC ..... *B29K 2083/00* (2013.01); *C08L 2205/025* (2013.01); *C09J 2483/00* (2013.01); *H10H 20/851* (2025.01); *H10H 20/854* (2025.01)

(58) Field of Classification Search
  CPC ........ C09J 7/10; B29C 45/0001; B29C 55/02; C08L 83/04; C08L 2205/025; B29K 2083/00; H10H 20/851; H10H 20/854; C08K 2003/2227; C08K 3/013; C08K 5/14; C08K 5/54; C08G 77/12; C08G 77/20; C08G 77/70; C09D 183/04; H01L 23/296; B32B 7/06; B32B 7/12
  See application file for complete search history.

(56) References Cited

U.S. PATENT DOCUMENTS

| | | |
|---|---|---|
| 5,169,727 A | 12/1992 | Boardman |
| 5,357,007 A | 10/1994 | Wengrovius et al. |
| 5,392,592 A | 2/1995 | Bozich et al. |
| 5,977,243 A | 11/1999 | Barthel et al. |
| 6,177,506 B1 | 1/2001 | Takahashi et al. |
| 6,376,569 B1 | 4/2002 | Oxman et al. |
| 6,379,792 B1 | 4/2002 | Isshiki et al. |
| 6,433,055 B1 | 8/2002 | Kleyer et al. |
| 8,124,689 B2 | 2/2012 | Loubert et al. |
| 2002/0132891 A1 | 9/2002 | Azechi et al. |
| 2004/0265599 A1 | 12/2004 | Ushio et al. |
| 2006/0057779 A1 | 3/2006 | Sutoh et al. |
| 2006/0094834 A1 | 5/2006 | Aoki et al. |
| 2006/0270788 A1 | 11/2006 | Ozai et al. |
| 2008/0319144 A1 | 12/2008 | Morita et al. |
| 2009/0042043 A1 | 2/2009 | Joseph et al. |
| 2009/0075009 A1 | 3/2009 | Fujisawa et al. |
| 2009/0171013 A1 | 7/2009 | Taguchi et al. |
| 2009/0281222 A1 | 11/2009 | Nishiumi et al. |
| 2011/0104506 A1 | 5/2011 | Behl et al. |
| 2011/0236666 A1 | 9/2011 | Hall et al. |
| 2012/0139131 A1 | 6/2012 | Sugo et al. |
| 2013/0183776 A1 | 7/2013 | Kashiwagi et al. |
| 2013/0200554 A1 | 8/2013 | Mueller |
| 2013/0274398 A1 | 10/2013 | Shiobara et al. |
| 2014/0296468 A1 | 10/2014 | Kownacka et al. |
| 2014/0377570 A1 | 12/2014 | Hirai et al. |
| 2015/0115311 A1 | 4/2015 | Yoshida et al. |
| 2015/0124338 A1 | 5/2015 | Mayumi et al. |
| 2015/0183960 A1 | 7/2015 | Yamazaki et al. |
| 2015/0315427 A1 | 11/2015 | Yoshida et al. |
| 2015/0376482 A1 | 12/2015 | Bekemeier et al. |
| 2016/0230005 A1 | 8/2016 | Mayumi et al. |
| 2016/0311980 A1 | 10/2016 | Knoer |
| 2017/0057980 A1 | 3/2017 | Boyer et al. |
| 2017/0058103 A1 | 3/2017 | Fujisawa et al. |
| 2017/0092822 A1 | 3/2017 | Amako et al. |
| 2017/0166701 A1* | 6/2017 | Jo .................. C08G 77/38 |
| 2017/0283613 A1 | 10/2017 | Mochizuki |
| 2017/0355804 A1 | 12/2017 | Fujisawa et al. |
| 2018/0105692 A1 | 4/2018 | Imaizumi et al. |
| 2018/0208816 A1 | 7/2018 | Yamazaki et al. |
| 2018/0305547 A1 | 10/2018 | Dogen et al. |
| 2019/0169398 A1 | 6/2019 | Yamazaki |
| 2019/0169435 A1 | 6/2019 | Yamazaki |
| 2019/0177488 A1 | 6/2019 | Yamazaki |
| 2019/0276684 A1 | 9/2019 | Yamazaki et al. |
| 2019/0367744 A1 | 12/2019 | Chevalier et al. |
| 2020/0216671 A1 | 7/2020 | Matsuzaki et al. |
| 2020/0224069 A1 | 7/2020 | Itoh et al. |
| 2020/0354615 A1 | 11/2020 | Itoh et al. |
| 2020/0392335 A1 | 12/2020 | Yamazaki |
| 2021/0162704 A1 | 6/2021 | Sreeram et al. |
| 2021/0179783 A1 | 6/2021 | Yoshitake |
| 2021/0179849 A1 | 6/2021 | Yoshitake |
| 2021/0189129 A1 | 6/2021 | Yamazaki et al. |
| 2021/0198489 A1 | 7/2021 | Yoshitake |
| 2021/0269691 A1 | 9/2021 | Itoh et al. |
| 2021/0284888 A1 | 9/2021 | Itoh et al. |
| 2021/0292607 A1 | 9/2021 | Itoh et al. |
| 2022/0002493 A1 | 1/2022 | Sugie et al. |
| 2022/0048230 A1 | 2/2022 | Imaizumi et al. |
| 2022/0064447 A1 | 3/2022 | Yamazaki |
| 2022/0064491 A1 | 3/2022 | Yamazaki |
| 2022/0089872 A1 | 3/2022 | Fukui et al. |
| 2022/0169894 A1 | 6/2022 | Yamazaki et al. |
| 2022/0186099 A1 | 6/2022 | Yamazaki et al. |
| 2022/0195269 A1 | 6/2022 | Yamazaki |
| 2022/0340756 A1 | 10/2022 | Nishijima et al. |
| 2022/0403114 A1 | 12/2022 | Sugie et al. |
| 2023/0044439 A1 | 2/2023 | Yamamoto et al. |
| 2023/0137947 A1 | 5/2023 | Yamazaki et al. |
| 2023/0151215 A1 | 5/2023 | Yamazaki et al. |
| 2024/0002605 A1 | 1/2024 | Tanaka et al. |
| 2024/0052106 A1 | 2/2024 | Yamazaki et al. |
| 2024/0052220 A1 | 2/2024 | Yamamoto et al. |

FOREIGN PATENT DOCUMENTS

| | | |
|---|---|---|
| CN | 103849149 A | 6/2014 |
| CN | 104870585 A | 8/2015 |
| CN | 106459419 A | 2/2017 |
| CN | 106715593 A | 5/2017 |
| CN | 107429062 A | 12/2017 |
| CN | 108026373 A | 5/2018 |
| CN | 109844029 A | 6/2019 |
| EP | 1002834 A1 | 5/2000 |
| EP | 3954739 A1 | 2/2022 |
| EP | 4083140 A1 | 11/2022 |
| EP | 4130157 A1 | 2/2023 |
| EP | 4269503 A1 | 11/2023 |
| JP | H0275681 A | 3/1990 |
| JP | H0625602 A | 2/1994 |
| JP | H10195085 A | 7/1998 |
| JP | H11158379 A | 6/1999 |
| JP | H11279182 A | 10/1999 |
| JP | H11335572 A | 12/1999 |
| JP | 2000063681 A | 2/2000 |
| JP | 2000198929 A | 7/2000 |
| JP | 2001019933 A | 1/2001 |
| JP | 2002155261 A | 5/2002 |
| JP | 2003176462 A | 6/2003 |
| JP | 2003226812 A | 8/2003 |
| JP | 2004043814 A | 2/2004 |
| JP | 2004307691 A | 11/2004 |
| JP | 2004315571 A | 11/2004 |
| JP | 2005007331 A | 1/2005 |
| JP | 2006188593 A | 7/2006 |
| JP | 2006274007 A | 10/2006 |
| JP | 2007119768 A | 5/2007 |
| JP | 2007231039 A | 9/2007 |
| JP | 2009503133 A | 1/2009 |
| JP | 2009132797 A | 6/2009 |
| JP | 2009155415 A | 7/2009 |
| JP | 2010047646 A | 3/2010 |
| JP | 2010047676 A | 3/2010 |
| JP | 2010509088 A | 3/2010 |
| JP | 2011525444 A | 9/2011 |
| JP | 2012017427 A | 1/2012 |
| JP | 2013076050 A | 4/2013 |
| JP | 2013523482 A | 6/2013 |
| JP | 2013147546 A | 8/2013 |
| JP | 2013221075 A | 10/2013 |
| JP | 2013221082 A | 10/2013 |
| JP | 2013222761 A | 10/2013 |
| JP | 2013232580 A | 11/2013 |
| JP | 5385247 B2 | 1/2014 |
| JP | 2014009322 A | 1/2014 |
| JP | 2014221915 A | 11/2014 |
| JP | 2015010132 A | 1/2015 |

(56) References Cited

FOREIGN PATENT DOCUMENTS

| | | |
|---|---|---|
| JP | 2015110752 A | 6/2015 |
| JP | 2015214637 A | 12/2015 |
| JP | 2016124967 A | 7/2016 |
| JP | 2017512224 A | 5/2017 |
| JP | 2017101137 A | 6/2017 |
| JP | 2017520918 A | 7/2017 |
| JP | 2017226724 A | 12/2017 |
| JP | 2018519369 A | 7/2018 |
| JP | 2018177993 A | 11/2018 |
| JP | 2019167832 A | 10/2019 |
| JP | 2019167833 A | 10/2019 |
| JP | 2021107149 A | 7/2021 |
| JP | 2021108319 A | 7/2021 |
| TW | 201439219 A | 10/2014 |
| WO | 2006104236 A1 | 10/2006 |
| WO | 2008056810 A1 | 5/2008 |
| WO | 2013051600 A1 | 4/2013 |
| WO | 2014002918 A1 | 1/2014 |
| WO | 2014136805 A1 | 9/2014 |
| WO | 2015056483 A1 | 4/2015 |
| WO | 2015126780 A1 | 8/2015 |
| WO | 2015155949 A1 | 10/2015 |
| WO | 2016038836 A1 | 3/2016 |
| WO | 2016103654 A1 | 6/2016 |
| WO | 2016136243 A1 | 9/2016 |
| WO | 2017068762 A1 | 4/2017 |
| WO | 2018028792 A1 | 2/2018 |
| WO | 2018030286 A1 | 2/2018 |
| WO | 2018030287 A1 | 2/2018 |
| WO | 2018030288 A1 | 2/2018 |
| WO | 2018084012 A1 | 5/2018 |
| WO | 2018186161 A1 | 10/2018 |
| WO | 2018235491 A1 | 12/2018 |
| WO | 2018235492 A1 | 12/2018 |
| WO | 2019059351 A1 | 3/2019 |
| WO | 2019078140 A1 | 4/2019 |
| WO | 2019088067 A1 | 5/2019 |
| WO | 2019208756 A1 | 10/2019 |
| WO | 2020090797 A | 5/2020 |
| WO | 2020138055 A1 | 7/2020 |
| WO | 2020138409 A1 | 7/2020 |
| WO | 2020138410 A1 | 7/2020 |
| WO | 2020166692 A1 | 8/2020 |
| WO | 2020203304 A1 | 10/2020 |
| WO | 2020203307 A1 | 10/2020 |
| WO | 2021132710 A1 | 7/2021 |
| WO | 2021200643 A1 | 10/2021 |
| WO | 2022004463 A1 | 1/2022 |
| WO | 2022138336 A1 | 6/2022 |

OTHER PUBLICATIONS

Machine assisted English translation of JP2013221082A obtained from https://patents.google.com/patent on Oct. 27, 2021, 14 pages.
Machine assisted English translation of WO2020138410A1 obtained from https://patents.google.com/patent on Oct. 27, 2021, 19 pages.
Machine assisted English translation of WO2020138409A1 obtained from https://patents.google.com/patent on Oct. 27, 2021, 24 pages.
Machine assisted English translation of WO2018235492A1 obtained from https://patents.google.com/patent on Oct. 27, 2021, 21 pages.
Machine assisted English translation of JP11335572A obtained from https://patents.google.com/patent on Oct. 27, 2021, 7 pages.
Machine assisted English translation of JPH11279182A obtained from https://patents.google.com/patent on Oct. 27, 2021, 8 pages.
Machine assisted English translation of JP2003176462A obtained from https://patents.google.com/patent on Oct. 27, 2021, 11 pages.
Machine assisted English translation of JP2009132797A obtained from https://patents.google.com/patent on Oct. 27, 2021, 9 pages.
Machine assisted English translation of JP2012017427A obtained from https://patents.google.com/patent on Oct. 27, 2021, 13 pages.
Machine assisted English translation of JP2000063681A obtained from https://patents.google.com/patent on Oct. 28, 2021, 8 pages.
Machine assisted English translation of JPH11158379A obtained from https://worldwide.espacenet.com/patent on Nov. 9, 2023, 11 pages.
Machine assisted English translation of CN103849149A obtained from https://worldwide.espacenet.com/patent on Jan. 22, 2024, 11 pages.
Machine assisted English translation of CN106715593A obtained from https://patents.google.com/patent on Mar. 14, 2023, 26 pages.
Machine assisted English translation of JP2005007331A obtained from https://patents.google.com/patent on Mar. 14, 2023, 15 pages.
Machine assisted English translation of JP2004315571A obtained from https://patents.google.com/patent on Mar. 14, 2023, 15 pages.
Machine assisted English translation of JP2015010132A obtained from https://patents.google.com/patent on Mar. 14, 2023, 22 pages.
Machine assisted English translation of JP2004307691A obtained from https://patents.google.com/patent on Mar. 14, 2023, 11 pages.
Machine assisted English translation of JP2013222761A obtained from https://patents.google.com/patent on Mar. 15, 2023, 20 pages.
Machine assisted English translation of JP2018177993A obtained from https://patents.google.com/patent on Mar. 15, 2023, 36 pages.
International Search Report for PCT/JP2019/051394 dated Mar. 17, 2020, 2 pages.
Machine assisted English translation of WO2018235492A1 obtained from https://patents.google.com/patent on Oct. 4, 2021, 20 pages.
Machine assisted English translation of JP2016124967A obtained from https://patents.google.com/patent on Oct. 4, 2021, 18 pages.
Machine assisted English translation of WO2016038836A1 obtained from https://patents.google.com/patent on Oct. 4, 2021, 18 pages.
Machine assisted English translation of WO2013051600A1 obtained from https://patents.google.com/patent on Oct. 4, 2021, 25 pages.
Machine assisted English translation of JP2007231039A obtained from https://patents.google.com/patent on Oct. 5, 2021, 7 pages.
International Search Report for PCT/JP2019/051393 dated Mar. 17, 2020, 3 pages.
International Search Report for PCT/JP2019/051392 dated Mar. 17, 2020, 2 pages.
International Search Report for PCT/JP2019/051391 dated Mar. 13, 2020, 3 pages.
International Search Report for PCT/JP2020/012028 dated Jun. 9, 2020, 3 pages.
International Search Report for PCT/JP2020/012030 dated Jun. 9, 2020, 2 pages.
International Search Report for PCT/JP2020/012029 dated Jun. 9, 2020, 3 pages.
International Search Report (with English translation) for PCT/JP2020/049074 dated Mar. 23, 2021, 7 pages.
Machine assisted English translation of JPH0625602 obtained from https://patents.google.com/patent on Nov. 11, 2022, 6 pages.
Machine assisted English translation of JP2019167832 obtained from https://patents.google.com/patent on Nov. 11, 2022, 11 pages.
Machine assisted English translation of JP2019167833 obtained from https://patents.google.com/patent on Nov. 11, 2022, 9 pages.
International Search Report (with English translation) for PCT/JP2021/012840 dated Jun. 15, 2021, 6 pages.
English translation of International Search Report for PCT/JP2022/046146 dated Jan. 31, 2023, 2 pages.
Machine assisted English translation of JP2017101137A obtained from https://worldwide.espacenet.com/patent on Apr. 7, 2024, 18 pages.
Machine assisted English translation of JP2021108319A obtained from https://worldwide.espacenet.com/patent on Mar. 12, 2024, 73 pages.
Machine assisted English translation of WO2020138055A1 obtained from https://worldwide.espacenet.com/patent on Apr. 7, 2024, 43 pages.
Machine assisted English translation of JPH10195085A obtained from https://patents.google.com/patent on Jan. 22, 2025, 10 pages.
Machine assisted English translation of JP2014221915A obtained from <https://patents.google.com/patent> on Nov. 20, 2024, 17 pages.
English translation of International Search Report for PCT/JP2019/042320 dated Mar. 24, 2020, 2 pages.

(56) References Cited

OTHER PUBLICATIONS

Machine assisted English translation of JP2010047676A obtained from https://patents.google.com/patent on Jul. 21, 2021, 9 pages.
Machine assisted English translation of JP2015214637A obtained from https://patents.google.com/patent on Jul. 21, 2021, 11 pages.
Machine assisted English translation of JP2017101137A obtained from https://patents.google.com/patent on Jul. 21, 2021, 11 pages.
English translation of International Search Report for PCT/JP2021/046092 dated Feb. 8, 2022, 2 pages.
English translation of International Search Report for PCT/JP2021/046093 dated Mar. 15, 2022, 2 pages.
Dowsiltm EA-4600 Silicone Adhesive Application Guide for PCT Device Assemblies (Dow Toray Co., Ltd. publication, Form No. 1-3497-42-1120 S2D, 2020).
Machine assisted English translation of WO2019208756A1 obtained from https://worldwide.espacenet.com/patent on Dec. 21, 2023, 32 pages.
Machine assisted English translation of JP2017226724A obtained from https://patents.google.com/patent on Aug. 14, 2024, 14 pages.
Machine assisted English translation of JP2003226812A obtained from https://patents.google.com/patent on Aug. 14, 2024, 11 pages.
Machine assisted English translation of JP2010047646A obtained from https://patents.google.com/patent on Aug. 14, 2024, 9 pages.

\* cited by examiner

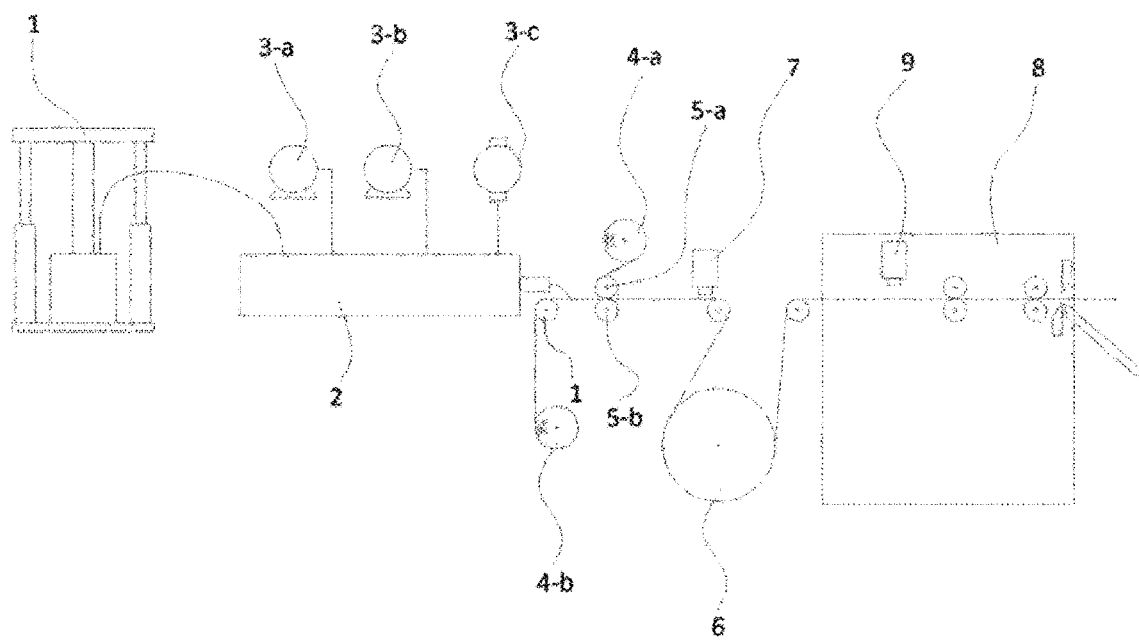

CURABLE SILICONE COMPOSITION, CURED PRODUCT OF SAME, AND METHOD FOR MANUFACTURING SAME

CROSS-REFERENCE TO RELATED APPLICATIONS

This application is the U.S. National Stage of International Application No. PCT/JP2020/012027 filed on 18 Mar. 2020, which claims priority to and all advantages of Japanese Application No. 2019-066558 filed on 29 Mar. 2019 and Japanese Application No. 2019-237945 filed on 27 Dec. 2019, the contents of which are incorporated herein by reference.

TECHNOLOGICAL FIELD OF THE PRESENT INVENTION

The present invention relates to a curable silicone composition having hot meltability and superior moldability, a molded product thereof (pellet, sheet, or the like), and a cured product thereof that can be obtained by a simple manufacturing method, is and which does not significantly increase in hardness and embrittlement even when its cured product is exposed to a temperature of at least 150° C. The present invention is related to a cured product of the composition as well as applications thereof (including, in particular, a member for semiconductors and a semiconductor having the cured product, and the like), a method for manufacturing the composition and a method for molding the cured product, etc.

BACKGROUND ART

Curable silicone compositions are utilized in a wide range of industrial fields because they are cured to form cured products having superior heat resistance, cold resistance, electrical insulation, weather resistance, water repellency, and transparency. In general, the cured product of such a curable silicone composition is also suitable as an encapsulant for optical materials and semiconductor devices because the composition is not readily discolored, as compared with other organic materials, and there is less deterioration of physical properties.

The present applicant has proposed, in Patent Document 1 and Patent Document 2, a so-called hot-melt curable granular silicone composition and a reactive silicone composition for molding. These silicone compositions comprise so-called phenyl silicone resins, which have the advantages of superior hot-melt properties and superior hardness and strength of the cured product when compared to methyl silicone resins.

On the other hand, in recent years, optical semiconductor devices have become smaller and higher output, and when these hot-melt curable granular silicone compositions and the like are applied, especially under high temperatures of 200° C. or higher, coloring derived from phenyl silicone resin may occur, and in particular, in the field of reflective materials, light reflectance may decrease. Therefore, there is a strong need for a silicone composition that satisfies the requirements for higher heat resistance and color resistance while achieving hot-melt properties and mechanical strength of the cured product after molding.

Here, in Patent Document 3, the applicant also discloses a transparent hot-melt curable silicone sheet that uses methyl silicone resin. However, when the cured product formed from these compositions is exposed to a temperature of 150° C. or higher for a long period of time, there is a problem in that the hardness increases dramatically, allowing for embrittlement to proceed, and there is a problem that the cured product is difficult to use in applications where the semiconductor device is encapsulated.

RELATED ART DOCUMENTS

Patent Documents

Patent Document 1: International Publication WO 2016/136243 Pamphlet
Patent Document 2: Japanese Unexamined Patent Application No. 2014-009322
Patent Document 3: Japanese Unexamined Patent Application Publication (Translation of PCT Application) No. 2017-512224

SUMMARY OF THE INVENTION

Problem to be Solved by the Invention

An object of the present invention is to provide a curable silicone composition that has hot-melt properties, exhibits low coloring when hot, and provides a cured product that is not prone to increased hardness or brittleness when exposed to high temperatures of 150° C. or higher for extended periods of time. Furthermore, the present invention provides this manner of curable silicone compositions in the form of particles, pellets, sheets, and the like, and in the form of peelable laminates containing said curable silicone composition sheets. An object of the present invention is to provide a semiconductor device member made up of a curable silicone composition cured product, a semiconductor device having the cured product, and a molding method of the cured product.

Means for Solving the Problem

As a result of intensive investigation, the present inventors have found that the problems described above can be resolved by the use of a curable silicone composition that is hot-meltable as an entire composition, while comprising: an organopolysiloxane resin having no hot-melt properties as a whole molecule and containing 20 mol % or more of siloxane units represented by $SiO_{4/2}$ relative to the total siloxane units in the resin; a liquid straight or branched chain organopolysiloxane; and a curing agent, where the mass loss rate of the organopolysiloxane resin when exposed to 200° C. for 1 hour is 2.0 mass % or less, thus arriving at the present invention.

More particularly, the issues described above can be solved by a curable silicone composition that is hot-meltable as an entire composition, comprising: (A) 100 mass parts or organopolysiloxanes containing component (A1) and component (A2) described below at a mass ratio of 0:100 to 90:10, and the mass loss when component (A1) and component (A2) are exposed for 1 hour at 200° C. is 2.0 mass % or less;

(A1) an organopolysiloxane resin that does not have hot-melt properties as a whole molecule, has a curing reactive functional group containing a carbon-carbon double bond in the molecule, and 20 mol % or more of its total siloxane units is siloxane units represented by $SiO_{4/2}$;

(A2) an organopolysiloxane resin that does not have hot-melt properties as a whole of the molecule, does not have a curing reactive functional group containing a carbon-carbon double bond in the molecule, and 20 mol % or more of its total siloxane units is siloxane units represented by $SiO_{4/2}$;

(B) 10 to 100 mass parts of a straight or branched chain organopolysiloxane, liquid or plastic at 25° C., having at least two curing reactive functional groups containing a carbon-carbon double bond in the molecule;

(C) one or more curing agents selected from (c1) or (c2) below, in an amount required for curing the curable silicone composition:

(c1) an organic peroxide, or (c2) an organohydrogenpolysiloxane having at least two silicon-bonded hydrogen atoms in the molecule and a hydrosilylation reaction catalyst.

Here, said curable silicone composition may optionally contain a functional filler (D), and component (D) may be contained in an amount in the range of 10 to 2,000 mass parts per 100 mass parts of the sum of components (A) and (B). Such curable silicone composition may be in the form of particles, pellets, or sheets.

The curable silicone composition described above may be in the form of a substantially flat, 10 to 1,000 μm thick curable silicone composition sheet.

Furthermore, the curable silicone composition described above can be used in a peelable laminate having the following configuration. That is, the form may be a peelable laminate including:

the curable silicone composition sheet described above, and a sheet-like substrate equipped with a release surface on one or both surfaces of the curable silicone composition sheet, such release surface facing the curable silicone composition sheet. Such curable silicone composition sheets may be used as film or sheet silicone adhesives.

Furthermore, the present inventors have found that the cured product of the curable silicone composition, in particular, use of the cured product as a member for semiconductor devices, and semiconductor devices having the cured product (including one or more types selected from power semiconductor devices, optical semiconductor devices, and semiconductor devices mounted on flexible circuit boards) can resolve the problem described above, thus arriving at the present invention.

Similarly, the inventors have found that the problem described above can be solved by: a manufacturing method characterized in that the components that make up the curable silicone composition described above are granulated by mixing only them under temperature conditions not exceeding 50° C., and a molding method of a cured product using the curable granular silicone composition described above.

Note that examples of the molding method described above includes transfer molding, compression molding, or injection molding, and the curable silicone composition of the present invention is suitably used as a material for these molding methods. Furthermore, the curable silicone composition of the present invention can be suitably used as a molding material in a so-called overmold method, which is a step of coating a semiconductor element or a semiconductor circuit board with the cured product by overmold molding.

Similarly, the present inventors provide a method for manufacturing a curable silicone composition sheet, including the following steps.

Step 1: step of mixing raw material component of the curable silicone composition described above at a temperature of 50° C. or higher Step 2: step of kneading the mixture obtained in step 1 while heat-melting Step 3: step of laminating the heat-melted mixture obtained in step 2 between films provided with at least one release surface Step 4: step of extending the laminate body obtained in step 3 between rollers to mold a curable silicone sheet having a specific film thickness Effect of the Invention The curable silicone composition of the present invention has hot-melt properties and has excellent handling workability and curing characteristics for use in the overmolding method and such. Because the cured product of the curable silicone composition is not prone to increased hardness and brittleness even when exposed to a temperature exceeding 150° C. for an extended period of time when used for encapsulating and protecting a semiconductor device, in particular, at high temperatures, the cured product layer can be prevented from fracturing or cracking over time, and the durability and reliability of the semiconductor device can be improved. In addition, the curable silicone composition of the present invention can contain a relatively high amount of functional inorganic filler without impairing the flexibility and stress relief properties of the cured product, and enabling imparting a desired function such as heat dissipation to the cured product. In addition, such curable silicone compositions can be produced using only simple mixing processes and can be efficiently manufactured. Furthermore, according to the present invention, the curable silicone composition can be provided in the form of a granular, pelletized, sheet-like, or the like, or in the form of a peelable laminate including the curable silicone composition sheet. As a result, in the manufacturing process of the semiconductor device or the like, the material can be cut to a desired size and used as necessary, and the applicability to industrial production processes is excellent.

BRIEF DESCRIPTION OF THE DRAWINGS

FIG. 1 is a diagram of the overall configuration of the manufacturing device (all parts, including turning it into a sheet form) of the curable hot-meltable silicone composition sheet of the manufacturing example.

DESCRIPTION OF THE PREFERRED EMBODIMENTS

[Curable Silicone Composition]

The curable silicone composition of the present invention contains as one of the main components an organopolysiloxane resin where 20 mol % or more of its total siloxane units are siloxane units represented by $SiO_{4/2}$ and a mass loss of which, when exposed for 1 hour to 200° C., is 2.0 mass % or less. Furthermore, the composition of the present invention is further characterized by having hot-melt properties as a whole. In the present invention, unless otherwise stated, "having hot-melt properties" means having a softening point of 50 to 200° C., having a melt viscosity at 150° C. (suitably, a melt viscosity of less than 1,000 Pa·s), and having flowing properties.

[Technical Significance of Weight Loss Ratio of Organopolysiloxane Resin]

Here, the mass loss rate of the organopolysiloxane resin when exposed for 1 hour at 200° C. of 2.0 mass % or less means that the amount of volatile component of the organopolysiloxane resin is low. A first feature of the present invention is to use an organopolysiloxane resin having a high content of a specific branched siloxane unit ($SiO_{4/2}$), where the amount of volatile components in the resin is very low. Specifically, the mass loss rate of this organopolysiloxane resin, which is component (A) described below, is 2.0 mass % or less when exposed to 200° C. for 1 hour, preferably 1.5 mass % or less, and more preferably 1.0 mass % or less.

Generally, in the production process of organopolysiloxane resins containing a large number of branched siloxane units, volatile low molecular weight components are easily produced and mixed into the resin. However, these volatile components have the effect of greatly reducing the hardness of the cured product obtained from the composition defined in the present invention. Therefore, when the cured product is exposed to a temperature exceeding 150° C. for a long period of time, the low molecular weight component will volatilize and, as a result, the hardness of the cured product is significantly increased. Furthermore, when the network of the silicone cured product contains a large amount of siloxane units as expressed by $SiO_{4/2}$, the cured product tends to be extremely brittle in terms of hardness, and consequently, embrittlement also occurs. By employing the configuration defined in the present invention, a cured product that is not prone to increasing hardness and embrittlement even when exposed to a temperature exceeding 150° C. for a long period of time can be provided. Therefore, when the mass loss of the organopolysiloxane resin when exposed for 1 hour at 200° C. exceeds the upper limit, the hardness of the obtained cured product dramatically increases particularly at high temperatures, and embrittlement tends to occur. Note that the lower limit of the mass loss rate is particularly preferably 0.0 mass % or not containing volatile low molecular weight components, but the hardness change of the cured product can be sufficiently suppressed in practical use in a range of 0.1 to 2.0 mass %, in a range of 0.2 to 1.5 mass %, and in a range of 0.3 to 0.8 mass %.

The species of the volatile low molecular weight component is not particularly limited, but since the organopolysiloxane resin of the present invention contains a large number of branched siloxane units (Q units) expressed as $SiO_{4/2}$, the volatile siloxane component as expressed by $M_4Q$ is easily generated as a byproduct by a reaction with the siloxane units (M units) expressed as $R_3SiO_{1/2}$. In the present invention, it is particularly preferable that the aforementioned mass reduction rate is achieved by removing the volatile low molecular weight component having the volatile siloxane component as a main component from the organopolysiloxane resin.

[Hot-Melt Properties and Composition of Curable Silicone Compositions]

The curable silicone composition of the present invention has hot-melt properties as an entire composition, has a softening point of 50° C. or higher, has a melt viscosity at 150° C. (suitably, a melt viscosity of less than 1,000 Pa·s), and has flowing properties. The individual components of said composition need not have hot-melt properties, and in particular, when the curing reactive or non-reactive organopolysiloxane resin is in particulate form, it is particularly preferred that these components do not have hot-melt properties at a temperature below 200° C.

The curable silicone composition of the present invention may be and is preferably molded into granules, pellets or sheet form, depending on the application thereof. Hereinafter, each component and optional component of the composition will be described. In the present invention, the term "average particle diameter" means the average particle diameter of the primary particles unless otherwise defined.

More specifically, the curable silicone composition of the present invention includes:

(A) 100 mass parts or organopolysiloxanes containing component (A1) and component (A2) described below at a mass ratio of 0:100 to 90:10, and the mass loss when component (A1) and component (A2) are exposed for 1 hour at 200° C. is 2.0 mass % or less;

(A1) an organopolysiloxane resin that does not have hot-melt properties as a whole molecule, has a curing reactive functional group containing a carbon-carbon double bond in the molecule, and 20 mol % or more of its total siloxane units is siloxane units represented by $SiO_{4/2}$;

(A2) An organopolysiloxane resin having no hot-melt properties as a whole molecule, having no curing reactive functional groups containing a carbon-carbon double bond in the molecule, and 20 mol % or more of its total siloxane units is siloxane units represented by $SiO_{4/2}$;

(B) 10 to 100 mass parts of a straight or branched chain organopolysiloxane, liquid at 25° C., having at least two curing reactive functional groups containing a carbon-carbon double bond in the molecule;

(C) one or more curing agents selected from (c1) or (c2) below, in an amount required for curing the curable silicone composition:

(c1) an organic peroxide;

(c2) an organohydrogenpolysiloxane having at least two silicon-bonded hydrogen atoms in the molecule and a hydrosilylation reaction catalyst;

and may optionally include (D) a functional inorganic filler, and/or (E) hot-meltable particles or other additives having a dripping point of 50° C. or more and a melt viscosity of 10 Pas or less, as measured by a rotational viscometer at 150° C., and/or other additives.

Each of the components and their content will be described below.

[Component (A)]

The curable silicone composition of the present invention comprises an organopolysiloxane resin where 20 mol % or more of the total siloxane units of the resin is siloxane units represented by $SiO_{4/2}$ and does not have hot-melt properties as a whole molecule. The organopolysiloxane resin may further contain a siloxane unit represented by $R_3SiO_{1/2}$, $R_2SiO_{2/2}$, $RSiO_{3/2}$ (R is a monovalent organic group), or a hydroxyl group or an alkoxy group represented by $R^2O_{1/2}$ ($R^2$ is a hydrogen atom or an alkyl group having 1 to 10 carbon atoms) but suitably includes siloxane units represented by $SiO_{4/2}$ in a range of 40 mol % or more, and in particular 40 to 90 mol % of its total siloxane units. If the content of the siloxane units represented by $SiO_{4/2}$ is less than the lower limit described above, the technical effect of the present invention may not be achieved even if a large amount of other branched siloxane units (for example, $RSiO_{3/2}$) are included.

As described above, the amount of volatile low molecular weight components in the organopolysiloxane resin needs to be low, and the volatile components generated in the production step need to be removed. The volatile low molecular weight components must be removed from the organopolysiloxane resin. The degree of said removal is defined the same as the rate of mass loss when the resin is exposed to 200° C. for 1 hour as described above, and it is necessary for a rate of mass loss to be 2.0 mass % or less.

Such an organopolysiloxane resin is defined as an organopolysiloxane resin comprising component (A1) and component (A2) at a mass ratio of 0:100 to 90:10 wherein component (A1) and component (A2) are:

(A1) an organopolysiloxane resin having no hot-melt properties as a whole molecule, having a curing reactive functional group containing a carbon-carbon double bond in the molecule, and 20 mol % or more of its total siloxane units is siloxane units represented by $SiO_{4/2}$, and (A2) an organopolysiloxane resin that does not have hot-melt properties as a whole of the molecule, does not have a curing reactive functional group containing a carbon-carbon double bond in the molecule, and 20 mol % or more of its total siloxane units are siloxane units represented by $SiO_{4/2}$, and the mass loss rate when component (A1) and component (A2) are exposed to 200° C. for 1 hour is not greater than 2.0 mass %.

Note that component (A1) is an optional constituent in component (A), and use of only component (A2) is feasible.

Although component (A) described above does not have hot-melt properties as a whole molecule, hot-melt properties as a whole composition can be achieved by using component (A) in combination with component (B) described below in a prescribed quantitative range. Component (A) can also be used in the form of microparticles, alone or together with other components, in which case the microparticles are preferably spherical silicone microparticles having an average primary particle diameter of 1 to 20 μm.

[(A1) Organopolysiloxane Resin Having a Curing Reactive Functional Group]

Component (A1) is one of the base compounds of the composition, wherein 20 mol % or more of its total siloxane units are siloxane units represented by $SiO_{4/2}$, has no hot-melt properties by itself, and has a curing reactive functional group containing a carbon-carbon double bond in the molecule, and has a weight loss rate when exposed to 200° C. for 1 hour of 2.0 mass % or less.

Component (A1) must have a curing reactive group having a carbon-carbon double bond within the molecule. These curing reactive groups are hydrosilylation reactive or organic peroxide-curing functional groups, which form cured products by cross-linking reactions with other components. This type of curing reactive group is an alkenyl group or an acrylic group, and examples thereof include alkenyl groups having from 2 to 10 carbon atoms such as vinyl groups, allyl groups, butenyl groups, pentenyl groups, hexenyl groups, and heptenyl groups; and acrylic group-containing monovalent organic groups such as 3-methacryloxypropyl groups and 3-acryloxypropyl groups. Vinyl groups or hexenyl groups are particularly preferable.

Component (A1) is an organopolysiloxane resin that does not have hot-melt properties as a whole molecule and is solid in a solvent-free state. Here, the absence of hot-melt properties means that the resin, which is component (A1), does not by itself exhibit heat-melting behavior at 200° C. or lower, and specifically means that the component does not have a softening point or melt viscosity at a temperature of 200° C. or lower. For component (A1), such physical properties are not structurally restricted, but the functional group in the organopolysiloxane resin is preferably a monovalent hydrocarbon group having 1 to 10 carbon atoms, in particular, a functional group selected from an alkyl group having 1 to 10 carbon atoms such as a methyl group, and substantially free of aryl groups such as a phenyl group. If a large amount of phenyl groups and the like is included, the component may become hot-meltable and the characteristic effect of reinforcing the cured product of $SiO_{4/2}$ groups may be reduced.

Suitably, the functional group bonded to the silicone atom in component (A1) is a group selected from a methyl group and an alkenyl group such as a vinyl group, and it is preferable that 70 to 99 mol % of all functional groups bonded to silicone atoms are methyl groups, and it is more preferable that 80 to 99 mol % of all functional groups bonded to silicone atoms are methyl groups, and it is particularly preferable that 88 to 99 mol % of all functional groups bonded to silicone atoms are methyl groups, and that any other functional group bonded to a silicone atom is an alkenyl group such as a vinyl group. In such range, component (A1) is not hot-meltable, and can be designed as a component that is particularly superior in coloration resistance and the like at high temperatures regarding the cured product thereof. A small amount of a hydroxyl group or an alkoxy group may be included in said component (A1).

Component (A1) is an organopolysiloxane resin that is solid in a solvent-free state, and is characterized in that 20 mol % or more of the total siloxane units in the molecule is siloxane units represented by $SiO_{4/2}$. Suitably, these branched siloxane units are 40 mol % or more of the total siloxane units, and preferably 50 mol % or more, and in particular, preferably in the range of 50 to 90 mol %.

Suitably, component (A1) is a non-hot-melt organopolysiloxane resin (A1-1) represented by the following average unit formula: $(R^1_3 SiO_{1/2})_a(R^1_2 SiO_{2/2})_b(R^1 SiO_{3/2})_c (SiO_{4/2})_d(R^2 O_{1/2})_e$ (in the formula, each $R^1$ is independently a monovalent hydrocarbon group having 1 to 10 carbon atoms, provided however, that 1 to 12 mol % of all $R^1$ in a molecule is an alkenyl group; each $R^2$ is a hydrogen atom or an alkyl group having 1 to 10 carbon atoms; and a, b, c, d, and e are numbers satisfying the following: $0.10 \leq a \leq 0.60$, $0 \leq b \leq 0.70$, $0 \leq c \leq 0.80$, $0.2 \leq d \leq 0.65$, $0 \leq e \leq 0.05$, wherein $c+d > 0.20$, and $a+b+c+d=1$).

In the average unit formula above, each $R^1$ is independently a monovalent hydrocarbon group having 1 to 10 carbon atoms, such as methyl, ethyl, propyl, butyl, pentyl, hexyl, heptyl, or similar alkyl group; vinyl, allyl, butenyl, pentenyl, hexenyl, or similar alkenyl group; phenyl, tolyl, xylyl, or similar aryl group; benzyl, phenethyl, or similar aralkyl group; and chloromethyl, 3-chloropropyl, 3,3,3-trifluoropropyl, or similar halogenated alkyl group. Furthermore, 1 to 12 mol % of all $R^1$ in one molecule is an alkenyl group, and preferably 2 to 10 mol % of all $R^1$ in one molecule is an alkenyl group. If the alkenyl group content is less than the lower limit of the range described above, the mechanical strength (hardness, and the like) of the resulting cured product may be insufficient. On the other hand, if the content of the alkenyl group is below the upper limit of the range described above, the composition containing the component can achieve favorable hot-melt performance as an entire composition. Each $R^1$ is preferably a functional group selected from an alkyl group having 1 to 10 carbon atoms such as a methyl group or an alkenyl group such as a vinyl group or a hexenyl group, and from the viewpoint of the technical effect of the invention, the R1 preferably does not substantially contain an aryl group such as a phenyl group.

If a large amount of aryl groups such as phenyl groups are contained, component (A) itself may become hot-meltable and the technical effect of the present invention may not be achieved, and in the cured product, the effect of reinforcing the cured product peculiar to $SiO_{4/2}$ groups may be reduced.

In the formula, $R^2$ is an alkyl group having a hydrogen atom or 1 to 10 carbon atoms. Examples of the alkyl group for $R^2$ include methyl, ethyl, propyl, butyl, pentyl or hexyl. The relevant functional group $R^2O_{1/2}$ containing $R^2$ corresponds to the hydroxyl group or alkoxy group in component (A).

In the formula, "a" is a number indicating the percentage of siloxane units in the general formula: $R^1_3SiO_{1/2}$. This number satisfies $0.1 \leq a \leq 0.60$, preferably $0.15 \leq a \leq 0.55$. "a" being at or above the lower limit of the aforementioned range, the composition containing the component, the composition as a whole, can achieve favorable hot-melt performance. On the other hand, "a" being less than or equal to the upper limit of the aforementioned range, the mechanical strength (hardness, elongation rate, and the like) of the cured product obtained is not too low.

In the formula, "b" is a number indicating the percentage of siloxane units in the general formula: $R^1_2 SiO_{2/2}$. This number satisfies $0 \leq b \leq 0.70$, preferably $0 \leq b \leq 0.60$. "b" being less than or equal to the upper limit of the range, the composition containing the component can achieve favorable hot-melt performance as an entire composition and a composition with little stickiness at room temperature can be obtained.

In the formula, "c" is a number indicating the percentage of siloxane units in the general formula: $R^3SiO_{3/2}$. This number satisfies $0 \leq c \leq 0.80$ and preferably satisfies $0 \leq c \leq 0.75$. "c" being less than or equal to the upper limit of the range, the composition containing the component can achieve favorable hot-melt performance as a whole composition and a tack-free composition with little stickiness at room temperature can be obtained. In the present invention, c may be and is preferred to be 0.

In the formula, "d" is the ratio of $SiO_{4/2}$ siloxane units and is necessarily $0.20 \leq d \leq 0.65$, and particularly preferably is $0.25 \leq d \leq 0.65$. This is because within the above numerical range, the composition containing the component can achieve favorable hot-melt performance as a whole composition, and the resulting cured product has sufficient flexibility.

In the present invention, c may be 0, but it is necessary that c+d>0.20. If the value of c+d is less than the lower limit described above, favorable hot-melt performance cannot be achieved for the composition as a whole, and the technical effect of the present invention may not be sufficiently achieved.

In the formula, "e" is a number indicating the percentage of units in the general formula: $R^2O_{1/2}$, where the units are a hydroxyl group or alkoxy group bonded to a silicone atom that can be contained in the organopolysiloxane resin. This number satisfies $0 \leq e \leq 0.05$, preferably $0 \leq e \leq 0.03$. "e" being below the upper limit of the range, a material that achieves favorable hot-melt performance as an entire composition can be obtained. Note that the sum of a, b, c and d, which is the sum of each siloxane unit, is equal to 1.

Component (A1) is an organopolysiloxane resin having the characteristics described above, and from the perspective of handleability, can also be used as a true spherical organopolysiloxane resin microparticle having an average primary particle diameter of 1 to 20 μm as measured using a laser diffraction/scattering method or the like. By using such microparticulate component, the composition can be prepared or produced as a curable granular composition having superior workability and hot-melt properties. Here, the method of manufacturing component (A1) is not restricted, and a known method can be used.

The method of producing the microparticulate component (A1) includes, for example, a method of pulverizing the organopolysiloxane resin described above using a pulverizer, or a method of direct micronization in the presence of a solvent. The pulverizer may be, for example, but is not limited to, a roll mill, a ball mill, a jet mill, a turbo mill, or a planetary mill. Examples of a method of directly micronizing the organopolysiloxane in the presence of a solvent include, spraying by a spray dryer, or micronizing using a biaxial kneader or a belt dryer. In obtaining the microparticle component (A1), some of component (C) described below, such as a hydrosilylation reaction catalyst, may be particulated together with component (A1), but from the viewpoint of storage stability of the resulting composition, particulating a mixture having a property of curing by heating is not preferable.

In particular, by using a spray dryer or the like, component (A1) having a regular spherical shape and an average primary particle diameter of 1 to 500 μm, or suitably 1 to 20 μm, can be produced. The heating and drying temperature of the spray dryer needs to be appropriately set based on the heat resistance of the organopolysiloxane resin microparticles and the like. Note that in order to prevent secondary aggregation of the obtained microparticles, the temperature of the organopolysiloxane resin microparticles is preferably controlled below the glass transition temperature thereof. The organopolysiloxane resin microparticles thus obtained can be recovered by a cyclone, a bag filter, or the like.

Solvents may be used for the above particulation to the extent that they do not inhibit the curing reaction. Examples of the solvents include, but are not limited to, aliphatic hydrocarbons such as n-hexane, cyclohexane, and n-heptane; aromatic hydrocarbons such as toluene, xylene, and mesitylene; ethers such as tetrahydrofuran and dipropyl ether; silicones such as hexamethyldisiloxane, octamethyltrisiloxane, and decamethyltetrasiloxane; esters such as ethyl acetate, butyl acetate, and propylene glycol monomethyl ether; and ketones such as acetone, methyl ethyl ketone, and methyl isobutyl ketone.

[Component (A2)]

Component (A2) is one of the base compounds of the composition, and is an organopolysiloxane resin containing a curing reactive functional group that does not by itself exhibit hot-melt properties. When used together with component (A1) and component (B) in a prescribed quantitative range, hot-melt properties of the entire composition and excellent stress relief properties of the cured product are achieved. Such component (A2) may be used in particulate form, alone or together with another component (for example, component (A1), which is a non-reactive organopolysiloxane resin, and a part of the component (C), which is a curing agent), or may be blended with the component (A1) and component (B) to be treated as a hot-melt solid.

Component (A2) is an organopolysiloxane resin that does not have hot-melt properties as a whole molecule and is solid in a solvent-free state. Here, the absence of hot-melt properties means that the resin, which is component (A2), does not by itself exhibit heat-melting behavior, and specifically means that the resin does not have a softening point and melt viscosity. For component (A2), such physical properties are not structurally restricted, but the functional group in the organopolysiloxane resin is preferably a monovalent hydrocarbon group having 1 to 10 carbon atoms, in particular a functional group selected from an alkyl group having 1 to 10 carbon atoms such as a methyl group, and substantially free of aryl groups such as a phenyl group. If a large amount of phenyl groups and the like are included, the component may become hot-meltable and the characteristic effect of reinforcing the cured product of $SiO_{4/2}$ groups may be reduced.

Component (A2) is an organopolysiloxane resin which, similar to component (A1), is in solid form and where 20 mol % or more of its total siloxane units is siloxane units represented by $SiO_{4/2}$, but is characterized in that it does not have a curing-reactive functional group containing at least one carbon-carbon double bond in the molecule. That is, component (A2) is characterized in that the component does not contain an alkenyl group such as a vinyl group as a functional group in the organopolysiloxane resin. The functional group in this organopolysiloxane is a monovalent hydrocarbon group having 1 to 10 carbon atoms, particularly an alkyl group having 1 to 10 carbon atoms such as a methyl group, and the functional group is preferably substantially free of an aryl group such as a phenyl group.

The functional group bonded to the silicone atom in component (A2) is suitably an alkyl group with 1 to 10 carbon atoms such as a methyl group, and 70 to 100 mol % of all functional groups bonded to the silicone atoms are preferably methyl groups, more preferable that 80 to 100 mol % are methyl groups, and in particular preferably 88 to 100 mol % are methyl groups. In such a range, component (A2) can be designed as a component that is not hot-meltable and that is particularly effective in reinforcing the cured product containing siloxane units represented by $SiO_{4/2}$. A small amount of a hydroxyl group or an alkoxy group may be included in said component (A2).

Since component (A2) does not have a curing-reactive group having a carbon-carbon double bond in the molecule, the component does not form a cured product by itself. However, the component has a reinforcing effect on the cured product and improves the hot-melt properties of the composition as a whole. It may be used as needed in combination with component (A1) having a curing-reactive group, and this is a necessary component for achieving the technical effect of the present invention.

Component (A2) is an organopolysiloxane resin that is solid in a solvent-free state, and contains a siloxane unit that is a branched siloxane unit represented by $SiO_{4/2}$ making up 20 mol % or more of the total siloxane units in the molecule. Suitably, the siloxane units are at least 40 mol %, preferably 50 mol % or more, and particularly preferably in the range of 50 to 65 mol % of the total siloxane units.

Suitably, component (A2) is an organopolysiloxane resin not having any hot-melt properties represented by the following average unit formula(A2-1): $(R^3_3 SiO_{1/2})_f (R^3_2 SiO_{2/2})_g (R^3 SiO_{3/2})_h (SiO_{4/2})_i (R^2 O_{1/2})_j$ (in the formula, each $R^3$ is independently a monovalent hydrocarbon group having 1 to 10 carbon atoms and not containing a carbon-carbon double bond; $R^2$ is a hydrogen atom or an alkyl group having 1 to 10 carbon atoms; and f, g, h, i, and j are numbers satisfying the following: $0.35 \leq f \leq 0.55$, $0 \leq g \leq 0.20$, $0 \leq h \leq 0.20$, $0.45 \leq i \leq 0.65$, $0 \leq j \leq 0.05$, and $f+g+h+i=1$).

In the above average unit formula, each $R^3$ is independently a monovalent hydrocarbon group that has from 1 to 10 carbon atoms and does not contain any carbon-carbon double bonds, such as methyl, ethyl, propyl, butyl, pentyl, hexyl, heptyl, or similar alkyl group; phenyl, tolyl, xylyl, or similar aryl group; benzyl, phenethyl, or similar aralkyl group; and chloromethyl, 3-chloropropyl, 3,3,3-trifluoropropyl, or similar halogenated alkyl group; and the like. Herein, from the viewpoint of industrial production and the technical effect of the invention, 70 mol % or more of all $R^3$ in one molecule is preferably an alkyl group having 1 to 10 carbon atoms, such as a methyl group, and particularly preferable that 88 mol % or more is a methyl group. On the other hand, $R^3$ is preferably substantially free of an aryl group such as a phenyl group. If a large amount of aryl groups such as phenyl groups are contained, component (B) itself may become hot-meltable and the technical effect of the present invention may not be achieved, and the coloration resistance of the cured product at high temperatures may deteriorate.

In the formula, $R^2$ is the same as the groups described above.

In the formula, "f" is a number indicating the percentage of siloxane units in the general formula: $R^3_3 SiO_{1/2}$. This number satisfies $0.35 \leq f \leq 0.55$, preferably $0.40 \leq f \leq 0.50$. "f" being at or above the lower limit of the aforementioned range, then the composition containing the component, the composition as a whole, can achieve favorable hot-melt performance. On the other hand, "f" being less than or equal to the upper limit of the aforementioned range, the mechanical strength (hardness, and the like) of the cured product obtained is not too low.

In the formula, "g" is a number indicating the percentage of siloxane units in the general formula: $R^3_2 SiO_{2/2}$. This number satisfies $0 \leq g \leq 0.20$, preferably $0 \leq g \leq 0.10$. "g" being less than or equal to the upper limit of the range, the composition containing the component can achieve favorable hot-melt performance as a whole composition and a composition with little stickiness at room temperature can be obtained. In the present invention, "g" may be and is preferred to be 0.

In the formula, "h" is a number indicating the percentage of siloxane units in the general formula: $R^3 SiO_{3/2}$. This number satisfies $0 \leq h \leq 0.20$, preferably $0 \leq h \leq 0.10$. "h" being less than or equal to the upper limit of the range, the composition containing the component can achieve favorable hot-melt performance as an entire composition and a composition with little stickiness at room temperature can be obtained. In the present invention, "h" may be and is preferred to be 0.

In the formula, "i" is a number indicating the ratio of $SiO_{4/2}$ siloxane units where $0.45 \leq i \leq 0.65$, and $0.40 \leq d \leq 0.65$ is preferable, and $0.50 \leq d \leq 0.65$ is particularly preferable. Within this numerical range, the composition containing this component can achieve favorable hot-melt performance as a whole, superior mechanical strength of the resulting cured product, and favorable workability without stickiness as an entire composition.

In the formula, "j" is a number indicating the percentage of units in the general formula: $R^2 O_{1/2}$, where the units are a hydroxyl group or alkoxy group bonded to a silicone atom that can be contained in the organopolysiloxane resin. This number satisfies $0 \leq j \leq 0.05$, preferably $0 \leq j \leq 0.03$. "j" being below the upper limit of the range, a material that achieves favorable hot melt performance as an entire composition can be obtained. Note that, the sum of f, g, h, and i, which is the sum of each siloxane unit, is equal to 1.

Component (A2) is an organopolysiloxane resin having the characteristics described above, and from the perspective of handleability, can also be used as a regular spherical shaped organopolysiloxane resin microparticle having an average primary particle diameter of 1 to 20 μm as measured using a laser diffraction/scattering method or the like. By using this type of particulate component, the composition can be prepared or produced as a curable granular composition having superior workability and hot-melt properties.

Herein, the method for manufacturing component (A2) include the same methods as those indicated for component (A1) described above.

[Removal of Volatile Low Molecular Weight Components in Component (a)]

In the production process of component (A1) and component (A2), volatile low molecular weight components are generated. Specifically, these have a structure of $M_4Q$ and appear as a byproduct when polymerizing an organopolysiloxane resin made up of an M unit ($R^3_3SiO_{1/2}$) and a Q unit ($SiO_{4/2}$). The components with this structure have the effect of significantly reducing the hardness of the cured product consisting of the composition of the present invention. The organopolysiloxane resin used herein is polymerized in the presence of a highly co-soluble organic solvent, and the organic solvent is removed by drying under reduced pressure or the like to obtain a solid organopolysiloxane resin. However, the $M_4Q$ structure has high mutual solubility with the organopolysiloxane resin, and cannot be removed by drying conditions that remove the organic solvent. It is known that the structure can be removed by exposure to a temperature of 200° C. or higher for a short period of time. However, if these components are removed by exposure to a high temperature after integral molding with a substrate of a semiconductor and such, the volume of the cured product decreases and the hardness of the cured product increases remarkably, causing the dimensions of the molded material to change and warping to occur. Therefore, the $M_4Q$-structured components must be removed before the molding process with the substrate, in other words, while a raw material, in order to apply to an application of the present invention.

Examples of methods for removing the structure include a method of removing together with the aforementioned organic solvent using a biaxial kneader and a method of providing a particulate organopolysiloxane based on the method described below and then removing through drying in an oven or the like.

More specifically, component (A1) and component (A2) are produced in the presence of organic solvents, and volatile components appear as byproducts during synthesis. Since the volatile components can be removed by briefly treating the obtained coarse raw material, organopolysiloxane resin, at a high temperature of roughly 200 degrees, the organic solvent and volatile components can simultaneously be removed from component (A1) and component (A2) using a biaxial kneader set at roughly 200° C. When component (A1) and component (A2) are handled as spherical powders, the components can be converted into powder by removing the organic solvent with a spray dryer, but the volatile components can not be removed using this method. If the resulting powder is treated at a low temperature of about 120° C. for 24 hours, the volatile components can be removed without agglomeration of the powder.

[Mass Ratio of Component (A1) and Component (A2) in Component (A)]

In order to impart hot-melt properties to the composition as a whole, component (A2) or a mixture of component (A1) and component (A2) must be mixed with component (B) described below in a prescribed ratio, where the ratio of component (A1) to component (A2) may be in the range of 0:100 to 90:10, preferably in the range of 0:100 to 85:15, and more preferably in the range of 0:100 to 80:20. Component (A2) is not itself curable, but by adding a small amount of component (A1) and using in combination with the component (A2) in this composition, the elastic modulus at high temperatures of the cured product produced from this composition can be controlled. When the functional inorganic filler described below is added to the composition, by suitably adjusting the amount of the filler and the amount of component (A1) used, an appropriate elastic modulus and flexibility can be achieved. For example, when the amount of functional inorganic filler added is large or when reducing the elastic modulus of the cured product obtained to the extent possible is desired, the composition can be blended with only the component (A2) and not adding component (A1). On the other hand, if the functional inorganic filler described below is not added, the desired elastic modulus can be achieved at room temperature and at high temperature by increasing the amount of component (A2) added.

[Component (B)]

Component (B) is one of the base compounds of the present composition, is a straight- or branched-chain organopolysiloxane that is liquid or plastic at 25° C., and has at least two curing reactive functional groups containing a carbon-carbon double bonds in the molecule. These curing-reactive chain-like organopolysiloxane, when mixed with the aforementioned solid organopolysiloxane resin, confer hot-melt properties to the entire composition.

Component (B) must have a curing-reactive group having a carbon-carbon double bond in the molecule. Such curing reactive group is a hydrosilylation reactive or organic peroxide-curing functional group that forms a cured product based on a crosslinking reaction with other components. Such curing-reactive group is an alkenyl group or an acrylic group, and examples are the same groups described above, and a vinyl group or a hexenyl group is in particular preferable.

Component (B) is a straight- or branched-chain organopolysiloxane in a liquid or plastic state at 25° C. (room temperature), and when mixed with component (A) in a solid state at room temperature, the composition as a whole exhibits hot-meltability. The structure of the composition can be based on a branched-chain organopolysiloxane having a small number of branched siloxane units (for example, T units represented by the general formula: $R^4SiO_{3/2}$ ($R^4$ is independently a monovalent hydrocarbon group having 1 to 10 carbon atoms) or Q units represented by $SiO_{4/2}$, and suitably a straight-chain organopolysiloxane (B1) represented by the following structural formula

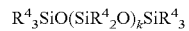

$$R^4_3SiO(SiR^4_2O)_kSiR^4_3$$

(In the formula, each $R^4$ is independently a monovalent hydrocarbon group having 1 to 10 carbon atoms, except that at least two of the $R^4$ in one molecule is an alkenyl group, and k is a number from 20 to 5,000).

Suitably, a straight-chain diorganopolysiloxane having one alkenyl group each at both ends of the molecular chain is preferred.

In the formula, each $R^4$ is independently a monovalent hydrocarbon group having 1 to 10 carbon atoms, such as methyl, ethyl, propyl, butyl, pentyl, hexyl, heptyl, or similar alkyl group; vinyl, allyl, butenyl, pentenyl, hexenyl, or similar alkenyl group; phenyl, tolyl, xylyl, or similar aryl group; benzyl, phenethyl, or similar aralkyl group; and chloromethyl, 3-chloropropyl, 3,3,3-trifluoropropyl, or similar alkyl halide group. Furthermore, at least two of the $R^4$ in one molecule are alkenyl groups, preferably a vinyl group. Each $R^4$ is also preferably a functional group selected from an alkyl group having 1 to 10 carbon atoms such as a methyl group or an alkenyl group such as a vinyl group or a hexenyl group, and it is particularly preferable that of all $R^4$, at least two are alkenyl groups, and the remaining $R^4$ are methyl groups. Note, from the viewpoint of the technical effect of the invention, $R^4$ is preferably substantially free of aryl groups such as phenyl groups. If a large amount of aryl groups such as phenyl groups are contained therein, the coloration resistance of the cured product at high temperatures may deteriorate. Particularly suitable is having an alkenyl group such as a vinyl group at both molecular terminals, the rest of the $R^4$ being methyl groups.

In the formula, "k" is a number between 20 and 5,000, preferably between 30 and 3,000, and particularly preferably between 45 and 800. "k" being at or above the lower limit of the aforementioned range, a composition having little stickiness at room temperature can be obtained. On the other hand, "k" being below the upper limit of the aforementioned range, the composition as a whole can achieve favorable hot-melt performance.

Here, in order to achieve hot-melt properties as an entire composition, the mass ratio of component (B), which is a linear or branched chain organopolysiloxane, relative to 100 mass parts of component (A), which is an organopolysiloxane resin, is in the range of 10 to 100 mass parts, preferably in the range of 10 to 70 mass parts, and more preferably in the range of 15 to 50 mass parts. If the amount of component (B) is in the range described above, the composition can achieve favorable hot-melt properties and the mechanical strength of the resulting cured product can be increased, and the stickiness of the resulting composition can be reduced at room temperature, thereby improving the workability thereof.

[Component (C)]

Component (C) is a curing agent for curing component (A) and component (B) described above, and is specifically one or more curing agents selected from (c1) or (c2) below. Two or more of these curing agents may be used in combination, for example, the cure system may include both component (c1) and component (c2).

(c1) an organic peroxide;
(c2) an organohydrogenpolysiloxane having at least two silicon-bonded hydrogen atoms in the molecule and a hydrosilylation reaction catalyst;

(c1) Organic peroxide is a component that cures component (A) and component (B) described above by heating, and examples include alkyl peroxides, diacyl peroxides, ester peroxides, and carbonate peroxides. Component (c1) can also react with some of the (A2) components.

Examples of alkyl peroxides include dicumyl peroxide, di-tert-butyl peroxide, di-tert-butylcumyl peroxide, 2,5-dimethyl-2,5-di(tert-butylperoxy)hexane, 2,5-dimethyl-2,5-di(tert-butylperoxy)hexyne-3, tert-butylcumyl, 1,3-bis(tert-butylperoxyisopropyl)benzene, and 3,6,9-triethyl-3,6,9-trimethyl-1,4,7-triperoxonan.

Examples of diacyl peroxides include benzoyl peroxide, lauroyl peroxide, and decanoyl peroxide.

Examples of ester peroxides include 1,1,3,3-tetramethylbutylperoxyneodecanoate, α-cumylperoxyneodecanoate, tert-butyl peroxyneodecanoate, tert-butylperoxyneoheptanoate, tert-butylperoxypivalate, tert-hexylperoxypivalate, 1,1,3,3-tetramethylbutylperoxy-2-ethylhexanoate, tert-amylperoxyl-2-ethylhexanoate, tert-butylperoxy-2-ethylhexanoate, tert-butylperoxyisobutyrate, di-tert-butylperoxyhexahydroterephthalate, tert-amylperoxy-3,5,5-trimethylhexanoate, tert-butylperoxy-3,5,5-trimethylhexanoate, tert-butylperoxyacetate, tert-butylperoxybenzoate, and di-t-butylperoxytrimethyladipate.

Examples of carbonate peroxides include di-3-methoxybutyl peroxydicarbonate, di(2-ethylhexyl)peroxydicarbonate, diisopropyl peroxycarbonate, tert-butyl peroxyisopropylcarbonate, di(4-tert-butylcyclohexyl)peroxydicarbonate, dicetyl peroxydicarbonate, and dimyristyl peroxydicarbonate.

This organic peroxide preferably has a 10-hour half-life temperature of not lower than 90° C. or not lower than 95° C. Examples of this manner of organic peroxide include dicumyl peroxide, di-tert-butyl peroxide, di-tert-hexyl peroxide, tert-butylcumyl peroxide, 2,5-dimethyl-2,5-di(tert-butylperoxy)hexane, 1,3-bis(tert-butylperoxyisopropyl)benzene, di-(2-tert-butylperoxyisopropyl)benzene, and 3,6,9-triethyl-3,6,9-trimethyl-1,4,7-triperoxonan.

While not limited thereto, the content of the (c1) organic peroxide is preferably within the range of 0.05 to 10 mass parts, or within the range of 0.10 to 5.0 mass parts, with regards to 100 mass parts of the sum of component (A) and component (B).

The organohydrogenpolysiloxane having at least two silicon-bonded hydrogen atoms in the (c2) molecule and the hydrosilylation reaction catalyst are components that cure the composition by an addition reaction (hydrosilylation reaction) of the organohydrogenpolysiloxane, a crosslinking agent, with the carbon-carbon double bond in component (A) and component (C) in the presence of the hydrosilylation reaction catalyst.

The structure of the crosslinking agent, organohydrogenpolysiloxane, is not particularly limited and may be straight-chain, branched-chain, cyclic, or resinous. In other words, component (c2) may be an organohydrogenpolysiloxane having, as the main constituent unit, a hydrogen organosiloxy unit represented by $HRSiO_{2/2}$ ($D^H$ unit, wherein R is independently a monovalent organic group), and at the end thereof a hydrogen diorganosiloxy unit represented by $HR_2SiO_{1/2}$ ($M^H$ unit, wherein R is independently a monovalent organic group). In particular, in the case of applications other than the molding process described below, even if the curable silicone composition is a chain-like organohydrogenpolysiloxane made up of the $D^H$ units described above, or the like, sufficient curing is possible for practical use.

On the other hand, when the curable silicone composition is used in a molding process, since the content of the curable reactive functional group containing a carbon-carbon double bond in the composition is small, from the viewpoint of curing speed, moldability, and curing properties thereof, the organohydrogenpolysiloxane preferably contains a monoorganosiloxy unit represented by $RSiO_{3/2}$ (T unit, where R is a monovalent organic group or a silicon-bonded hydrogen atom) or a siloxy unit (Q unit) represented by $SiO_{4/2}$, and at least two hydrogen diorganosiloxy units represented by $HR_2SiO_{1/2}$ ($M^H$ unit, where R is independently a monovalent organic group), and the organohydrogenpolysiloxane resin has a $M^H$ unit at the molecular terminal.

A particularly suitable organohydrogenpolysiloxane is an organohydrogenpolysiloxane resin represented by the following average unit formula:

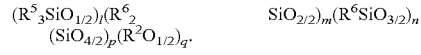

$(R^5_3SiO_{1/2})_l(R^6_2SiO_{2/2})_m(R^6SiO_{3/2})_n(SiO_{4/2})_p(R^2O_{1/2})_q$.

In the formula, each $R^5$ is the same or different and is a hydrogen atom or monovalent hydrocarbon group having 1 to 10 carbon atoms without an aliphatic unsaturated carbon bond, wherein at least two $R^5$ in one molecule are hydrogen atoms. Examples of the monovalent hydrocarbon group $R^5$ include methyl, ethyl, propyl, butyl, pentyl, hexyl, heptyl, or similar alkyl group; phenyl, tolyl, xylyl, or similar aryl group; benzyl, phenethyl, or similar aralkyl group; and chloromethyl, 3-chloropropyl, 3,3,3-trifluoropropyl, or similar alkyl halide group; and the like. From an industrial viewpoint, methyl groups or phenyl groups are preferred.

In the formula, $R^6$ is a monovalent hydrocarbon group having 1 to 10 carbon atoms without an aliphatic unsaturated carbon bond, for example, the same group as the monovalent hydrocarbon group described above. On the other hand, $R^2$ is a hydrogen atom or an alkyl group having 1 to 10 carbon atoms, for example, $R^2$ in the above component (A1) or component (A2).

In the formula, l, m, n and p are numbers that satisfy the following: $0.1 \leq l \leq 0.80$, $0 \leq m \leq 0.5$, $0 \leq n \leq 0.8$, $0 \leq p \leq 0.6$, $0 \leq q \leq 0.05$, where $n+p > 0.1$ and $l+m+n+p=1$. Here, when the present composition is used in a molding process, the organohydrogenpolysiloxane resins that are part of component (c2) are specifically preferred to be $M^H$MT resin, $M^H$MTT$^H$ resin, $M^H$MTQ resin, $M^H$MQ resin, $M^H$MTT$^H$Q, or $M^H$Q resin.

Particularly suitable is the organohydrogenpolysiloxane which is part of component (c2) and is a $M^H$Q resin represented by $(H(CH_3)_2SiO_{1/2})_{l1}(SiO_{4/2})_{p1}$. Here, $l1+p1=1$, and it is preferable to have $0.1 \leq l1 \leq 0.80$ and $0.20 \leq p1 \leq 0.90$.

Similarly, the organohydrogenpolysiloxane that is part of component (c2) may include straight-chain diorganopolysiloxane, organohydrogenpolysiloxane, or diorganopolysiloxane whose molecular chain ends are capped by silicon-bonded hydrogen atoms or trimethylsiloxy groups. The degree of polymerization of siloxane of these straight-chain organohydrogenpolysiloxanes is not particularly limited, but is in the range of 2 to 200, and is preferably in the range of 5 to 100.

The amount of the organohydrogenpolysiloxane, which is a part of component (c2), is an amount sufficient to cure the curable silicone composition of the present invention and relative to the curing reactive functional group containing a carbon-carbon double bond (for example, an alkenyl group such as a vinyl group) in component (A) and component (B), the molar ratio of the silicon-bonded hydrogen atom in the organohydrogenpolysiloxane is 0.5 or more and preferably in the range of 0.5 to 20. In particular, when component (c2) includes the organohydrogenpolysiloxane resin described above, the amount thereof is set so that, relative to the curing reactive functional group containing a carbon-carbon double bond in component (A) and component (B), the molar ratio of the silicon-bonded hydrogen atom in the organohydrogenpolysiloxane resin is in the range of 0.5 to 20 and preferably in the range of 1.0 to 10.

Examples of the hydrosilylation reaction catalyst that is a part of component (c2) include platinum-based catalysts, rhodium-based catalysts, and palladium-based catalysts. Platinum-based catalysts are preferred due to the ability to remarkably promote curing of the present composition. Examples of platinum-based catalysts include platinum fine powder, chloroplatinic acid, an alcohol solution of chloroplatinic acid, a platinum-alkenyl siloxane complex, a platinum-olefin complex, a platinum-carbonyl complex, and a catalyst in which these platinum-based catalysts are dispersed or encapsulated with a thermoplastic resin such as silicone resin, polycarbonate resin, acrylic resin or the like, with a platinum-alkenyl siloxane complex being particularly preferable. Examples of alkenylsiloxanes include: 1,3-divinyl-1,1,3,3-tetramethyldisiloxane, 1,3,5,7-tetramethyl-1,3,5,7-tetravinylcyclotetrasiloxane, alkenyl siloxanes obtained by substituting a portion of methyl groups of the alkenylsiloxanes with an ethyl group, a phenyl group, or the like; and alkenylsiloxanes obtained by substituting a portion of vinyl groups of these alkenylsiloxanes with an allyl group, a hexenyl group, or the like. In particular, 1,3-divinyl-1,1,3,3-tetramethyldisiloxane is preferably used because of the favorable stability of this platinum-alkenylsiloxane complex, and is preferably added in the form of a complex alkenylsiloxane solution. In addition, in terms of improving the workability as well as the pot life of the composition, a platinum containing hydrosilylation reaction catalyst in microparticulate dispersed and encapsulated with thermoplastic resin may be used. As the catalyst for promoting the hydrosilylation reaction, a non-platinum based metal catalyst such as iron, ruthenium, iron/cobalt, or the like may be used.

The addition amount of the hydrosilylation reaction catalyst, which is a part of component (c2), should be an amount in which metal atoms are in the range of 0.01 to 500 ppm, 0.01 to 100 ppm, or preferably 0.01 to 50 ppm in terms of mass units relative to the entire composition.

Particularly suitable component (c2) comprises an organohydrogenpolysiloxane resin represented by the average unit formula (c2-1) described above and a hydrosilylation reaction catalyst.

When the hydrosilylation reaction catalyst described above is used as a part of component (C), inclusion in the organopolysiloxane microparticles such as component (A1) and component (A2) when they are produced is preferable from the viewpoint of the storage stability of this curable silicone composition. However, the entire mixture made up of the microparticles preferably does not become curing reactive on its own.

The curable silicone composition of the present invention may further contain (D) functional filler in addition to the above components (A) to (C), if imparting functionality to the resulting cured product is desired.

The functional filler, which is component (D), is a component that imparts mechanical or other properties to the cured product, and examples include inorganic fillers, organic fillers, and mixtures thereof. Examples of the inorganic fillers include a reinforcing filler, a white pigment, a thermally conductive filler, an electrically conductive filler, a phosphor, and mixtures of at least two of these, and examples of organic fillers include a silicone resin filler, a fluorine resin filler, and a polybutadiene resin filler. The shape of these fillers is not particularly limited, and may be spherical, spindle-shaped, flat, needle-shaped, amorphous, or the like.

When the composition is used in applications such as an encapsulant, a protective agent, an adhesive, and the like, a reinforcing filler is preferably included in at least a part of component (D) from the viewpoint of improving the mechanical strength, protectiveness and adhesiveness of the cured product.

Reinforcing fillers may be added to improve the mechanical strength of the cured product, to improve protection and adhesion, and to maintain a solid particle shape as a binder filler in the curable silicone composition before curing. Examples of this type of reinforcing filler include fumed silica, precipitated silica, fused silica, calcined silica, fumed titanium dioxide, quartz, calcium carbonate, diatomaceous earth, aluminum oxide, aluminum hydroxide, zinc oxide, and zinc carbonate. These reinforcing fillers may also be surface-treated with organoalkoxysilanes such as methyltrimethoxysilane; organohalosilanes such as trimethylchlorosilane; organosilazanes such as hexamethyldisilazane; siloxane oligomers such as dimethylsiloxane oligomers capped with α,ω-silanol groups, methylphenylsiloxane oligomers capped with α,ω-silanol groups, methylvinylsiloxane oligomers capped with α,ω-silanol groups, or the like. The particle size of the reinforcing filler is not restricted, but the median diameter from a measurement using a laser diffraction/scattering type particle size distribution is preferably within a range of 1 nm to 500 μm. Furthermore, as the reinforcing filler, a fibrous filler such as calcium metasilicate, potassium titanate, magnesium sulfate, sepiolite, zonolite, aluminum borate, rock wool, glass fiber, or the like may be used.

Further, a white pigment, a thermally conductive filler, an electrically conductive filler, or a phosphor may be blended for the purpose of imparting other functions to the cured product obtained using the composition. Organic fillers such as silicone elastomer microparticles may also be blended for the purpose of improving the stress relief properties of the cured product.

The white pigment is a component that imparts whiteness to the cured product and improves light reflectivity, and the cured product resulting from curing the composition by blending the component can be used as a light reflective material for light emitting/optical devices. Examples of the white pigment include metal oxides such as titanium oxide, aluminum oxide, zinc oxide, zirconium oxide, magnesium oxide, and the like; hollow fillers such as glass balloons, glass beads, and the like; and additionally, barium sulfate, zinc sulfate, barium titanate, aluminum nitride, boron nitride, and antimony oxide. Titanium oxide has high optical reflectivity and concealing properties, and is therefore preferable. Furthermore, aluminum oxide, zinc oxide, and barium titanate have high optical reflectivity of a UV region, and are therefore preferable. The average particle size or shape of the white pigment is not restricted, but the average particle diameter is within a range of 0.05 to 10.0 μm and preferably within a range of 0.1 to 5.0 μm. Furthermore, surface treatment of the white pigment can be performed using a silane coupling agent, silica, aluminum oxide, and the like.

A thermally conductive filler or an electrically conductive filler is added to the cured product for the purpose of imparting thermal conductivity/electrical conductivity thereto, and specific examples include a metallic fine powder such as gold, silver, nickel, copper or aluminum; a fine powder such as ceramic, glass, quartz or organic resin, the surface thereof on which a metal such as gold, silver, nickel, or copper is deposited or plated; a metallic compound such as aluminum oxide, magnesium oxide, aluminum nitride, boron nitride or zinc oxide or the like; and graphite, and mixtures of two or more of these. When electrical insulation is required for the present composition, a metal oxide-based powder or a metal nitride-based powder is preferable, and in particular, an aluminum oxide powder, a zinc oxide powder, or an aluminum nitride powder is preferable and combinations of type, particle diameter, and particle shape and the like can be used according to these thermal conductivity/electrical conductivity requirements.

Phosphor is a component that is blended in to convert the emission wavelength from a light source (optical semiconductor device) when the cured product is used as a wavelength conversion material. There is no particular limitation on this phosphor, and examples of the phosphor include yellow, red, green, and blue light phosphors, which include oxide phosphors, oxynitride phosphors, nitride phosphors, sulfide phosphors, oxysulfide phosphors, and the like, which are widely used in light emitting diodes (LED).

Silicone microparticles include non-reactive silicone resin microparticles and silicone elastomer microparticles, but silicone elastomer microparticles are a suitable example from the viewpoint of improving cured product flexibility or stress relief properties.

The silicone elastomer microparticles are a crosslinked product of straight-chain diorganopolysiloxane made up primarily of diorganosiloxy units (D units). The silicone elastomer microparticles can be prepared by a crosslinking reaction of diorganopolysiloxane by a hydrosilylation reaction, a condensation reaction of a silanol group, or the like, and in particular, the silicone elastomer microparticles can be suitably obtained by a crosslinking reaction of organohydrogenpolysiloxane having a silicon-bonded hydrogen atom at a side chain or a terminal with diorganopolysiloxane having an unsaturated hydrocarbon group such as an alkenyl group at a side chain or a terminal in the presence of a hydrosilylation reaction catalyst. The silicone elastomer microparticles may have various shapes such as spherical, flat, and irregular shapes, but are preferably spherical in terms of dispersibility, and among these, regular spherical shape is more preferable. Commercial products of such silicone elastomer microparticles include, for example, "TREFIL™-E series" and "EP Powder series" manufactured by Dow Toray Co., Ltd. and "KMP series" manufactured by Shin-Etsu Chemical Co., Ltd.

For the purpose of stably blending the functional filler above in the present composition or the like, the filler surface may be treated using a specific surface treatment agent in the range of 0.1 to 2.0 mass %, 0.1 to 1.0 mass %, or 0.2 to 0.8 mass % of the total mass of component (D). Examples of these surface treatment agents include, methylhydrogen polysiloxane, silicone resins, metal soaps, silane coupling agents, perfluoroalkyl silanes, as well as fluorine compounds such as perfluoroalkyl phosphate ester salts.

In particular, when component (D) is a thermally conductive filler and is blended in large quantities into the curable silicone composition of the present invention, the thermally conductive filler is suitably a plate-shaped boron nitride powder having an average particle diameter of 0.1 to 30 μm, a granular boron nitride powder having an average particle diameter of 0.1 to 50 μm, a spherical and/or crushed aluminum oxide powder having an average particle diameter of 0.01 to 50 μm, or spherical and/or crushed graphite having an average particle diameter of 0.01 to 50 μm, or a mixture of two or more of these. A mixture of two or more types of spherical or crushed aluminum oxide powders having an average particle diameter of 0.01 to 50 μm is most suitable. In particular, the combination of aluminum oxide powders with large particle size and small particle size in the ratio following the maximum packing theoretical distribution curve improves the packing efficiency and enables low viscosity and high thermal conductivity.

Furthermore, said thermally conductive filler is particularly preferred to have at least part of the surface thereof treated with one or more organic silicon compounds. The suitable range of the processing volume is as described above. Examples of organic silicon compounds that are surface treatment agents are low molecular weight organic silicon compounds such as silanes, silazanes, siloxanes, or the like, and organosilicon polymers or oligomers such as polysiloxanes, polycarbosiloxanes, or the like. A so-called silane coupling agent is an example of a preferred silane. Typical examples of the silane coupling agents include alkyltrialkoxysilanes (such as methyltrimethoxysilane, vinyltrimethoxysilane, hexyltrimethoxysilane, octyltrimethoxysilane, and decyltrimethoxysilane, and the like) and trialkoxysilanes containing an organic functional group (such as glycidoxypropyltrimethoxysilane, epoxycyclohexyl ethyltrimethoxysilane, methacryloxypropyltrimethoxysilane, aminopropyltrimethoxysilane, and the like). Preferred siloxanes and polysiloxanes include hexamethyldisiloxanes, 1,3-dihexyl-tetramethyldisiloxanes, trialkoxysilyl single-terminated polydimethylsiloxanes, trialkoxysilyl single-terminated dimethylvinyl single-terminated polydimethylsiloxanes, trialkoxysilyl single-terminated organic functional group single-terminated polydimethylsiloxanes, trialkoxysilyl doubly-terminated polydimethylsiloxanes, organic functional group doubly-terminated polydimethylsiloxanes, and the like. When a siloxane is used, the number n of siloxane bonds is preferably within a range of 2 to 150. Examples of preferred silazanes include hexamethyldisilazanes, 1,3-dihexyl-tetramethyldisilazanes, and the like. A polymer having an Si—C—C—Si bond in a polymer main chain is an example of a preferred polycarbosiloxane.

The amount of component (D) is not restricted, but the amount is preferably within a range of 10 to 2,000 mass parts, within a range of 10 to 1500 mass parts, or within a range of 10 to 1000 mass parts with regards to the sum of component (A) and component (B) (100 mass parts) in order for the obtained cured product to have superior hardness and mechanical strength.

The curable silicone composition of the present invention comprises components (A) to (C) and optionally (D) described above, and from the viewpoint of further improving the melting properties thereof, (E) hot-melt particles with a drip point of 50° C. or higher and a melt viscosity measured by a rotational viscometer at 150° C. of less than 10 Pas may be added and is preferable.

The type of component (E) is not particularly limited, and one or more types selected from various hot-melt synthetic resins, waxes, fatty acid metal salts, and the like can be used, as long as the conditions of the drip point described above and kinematic viscosity at 150° C. during melting are satisfied. Component (E) exhibits low kinematic viscosity at high temperatures (150° C.) and forms a melt with superior flowability. Furthermore, by combining the components (A) to (C) described above, component (E) in the melt that makes up the present composition spreads quickly throughout the composition at high temperature, thereby lowering the viscidity between the substrate surface to which the molten composition is applied and the entire composition, rapidly lowering the surface friction of the substrate and the molten composition, and significantly increasing the fluidity of the entire composition. Therefore, the viscosity and flowability of the molten composition can be greatly improved by adding only a very small amount relative to the total amount of other components.

Component (E) can be a petroleum wax, such as a paraffin, as long as the kinetic viscosity requirements at the drip point and while melted described above are satisfied. However, from the viewpoint of the technical effect of the present invention, the hot-melt component preferably consists of a fatty acid metal salt or a erythritol derivative fatty acid ester and metal salts of higher fatty acids such as stearic acid, palmitic acid, oleic acid, isononanoic acid and the like, or pentaerythritol tetrastearate, dipentaerythritol adipic acid stearate, glycerintri-18-hydroxystearate, pentaerythritol full stearate are particularly preferred. Here, the types of the fatty acid metal salts described above are also not particularly limited, and suitable examples include alkali metal salts such as lithium, sodium, potassium, and the like; alkaline earth metal salts such as magnesium, calcium, barium, and the like; or zinc salts.

Particularly suitable as component (E) are (E0) fatty acid metal salts having a free fatty acid content of 5.0% or less, 4.0% or less, and 0.05 to 3.5% fatty acid metal salts and erythritol derivatives. Examples of such a component include at least one or more stearic acid metal salts. The use of a hot-melt component having a melting point of 150° C. or less, selected from the following is most preferred, specifically, calcium stearate (melting point 150° C.), zinc stearate (melting point 120° C.), magnesium stearate (melting point 130° C.), pentaerythritol tetrastearate (melting point 60-70° C.), pentaerythritol adipate stearate (melting point 55-61° C.), pentaerythritol full stearate (melting point 62-67° C.) and the like.

Regarding the amount of component (E) used, with the entire composition taken as 100 mass parts, the content of component (E0) is in the range of 0.01 to 5.0 mass parts, and may be 0.01 to 3.5 mass parts or 0.01 to 3.0 mass parts. If the amount of the component (E) used exceeds the upper limit, the adhesiveness and mechanical strength of the cured product obtained from the curable silicone composition of the present invention may be insufficient. If the amount of component (E) used is less than the lower limit, sufficient fluidity while heating and melting may not be achieved.

The present composition may contain a curing retardant or an adhesion promoter as another optional component as long as the object of the present invention is not impaired.

Examples of the curing retardant include: alkyne alcohols such as 2-methyl-3-butyne-2-ol, 3,5-dimethyl-1-hexyne-3-ol, 2-phenyl-3-butyne-2-ol, and 1-ethynyl-1-cychlohexanol, enyne compounds such as 3-methyl-3-pentene-1-yne, and 3,5-dimethyl-3-hexene-1-yne, alkenyl group-containing low molecular weight siloxanes such as tetramethyltetravinylcyclotetrasiloxane and tetramethyltetrahexenylcyclotetrasiloxane; and alkynyloxysilanes such as methyl tris(1,1-dimethyl propynyloxy)silane and vinyl tris(1,1-dimethyl propynyloxy)silane. The content of the curing retardant is not limited, but is preferably within the range of 10 to 10,000 ppm in terms of mass units, with regard to the composition.

As the adhesion promoter, an organic silicon compound having at least one alkoxy group bonded to a silicon atom in one molecule is preferable. Examples of this alkoxy group include a methoxy group, an ethoxy group, a propoxy group, a butoxy group, and a methoxyethoxy group, with a methoxy group particularly preferable. Moreover, examples of groups other than alkoxy group, bonded to the silicon atom of the organic silicon compound include: halogen substituted or unsubstituted monovalent hydrocarbon groups such as an alkyl group, an alkenyl group, an aryl group, an aralkyl group, and a halogenated alkyl group; glycidoxyalkyl groups such as a 3-glycidoxypropyl group and a 4-glycidoxybutyl group; epoxycyclohexylalkyl groups such as a 2-(3,4-epoxycyclohexyl)ethyl group and a 3-(3,4-epoxycyclohexyl)propyl group; epoxyalkyl groups such as a 3,4-epoxybutyl group and 7,8-epoxyoctyl groups; acryl group-containing monovalent organic groups such as 3-methacryloxypropyl groups; and hydrogen atoms. This organic silicon compound preferably has a group that may react with an alkenyl group or a silicon-bonded hydrogen atom in this composition, and specifically, preferably has a silicon-bonded hydrogen atom or an alkenyl group. Moreover, because favorable adhesion can be imparted to various substrates, this organic silicon compound preferably has at least one epoxy group-containing monovalent organic group per molecule. Examples of such an organic silicon compound include an organosilane compound, an organosiloxane oligomer, and an alkyl silicate. Examples of molecular structures of this organosiloxane oligomer or alkyl silicate include a linear structure, a partially branched linear structure, a branched structure, a cyclic structure, and a network structure, among which a linear structure, a branched structure, and a network structure are particularly preferable. Examples of the organic silicon compound include silane compounds such as 3-glycidoxypropyltrimethoxysilane, 2-(3,4-epoxycyclohexyl) ethyltrimethoxysilane, and 3-methacryloxypropyltrimethoxysilane; siloxane compounds with at least one of each of a silicon-bonded alkenyl group or a silicon-bonded hydrogen atom and a silicon-bonded alkoxy group in one molecule; a silane compound or siloxane compound having at least one silicon-bonded alkoxy group; a mixture of siloxane compounds having at least one each of silicon-bonded alkenyl group and silicon-bonded alkenyl group in one molecule, a reaction mixture of an amino group-containing organoalkoxysilane and an epoxy group-containing organoalkoxysilane, and an organic compound having at least two alkoxysilyl groups containing bonds other than silicon-oxygen bonds between their silyl groups in one molecule; general formula:

(wherein, $R^a$ represents an organic group containing a monovalent epoxy group, Rb represents an alkyl group having 1 to 6 carbon atoms, or a hydrogen atom.
n represents a number within a range of 1 to 3),
representing epoxy group-containing silane or a partially hydrolyzed condensate, reaction mixture of vinyl group-containing siloxane oligomer (including chain or ring shaped structure) and epoxy group-containing trialkoxysilane, methyl polysilicate, ethyl polysilicate, and epoxy group-containing ethyl polysilicate.
The adhesion promoter is preferably in the form of a low viscosity liquid, and the viscosity thereof is not limited, but is preferably within the range of 1 to 500 mPa·s at 25° C. In addition, while not limited thereto, the content of this adhesion imparting agent is preferably within the range of 0.01 to 10 mass parts with regard to 100 mass parts of the total of the present composition.

In the present invention, a reaction mixture of an organoalkoxysilane containing an amino group and an organoalkoxysilane containing an epoxy group is exemplified as a particularly suitable adhesive promoter. Such component is a component for improving initial adhesiveness to various base materials in contact with during curing, in addition to improving adhesiveness at low temperatures particularly to an unwashed adherend. Moreover, some curing systems of a curable silicone composition obtained by blending this adhesion promoter may act as a crosslinking agent. Such a reaction mixture is disclosed in Japanese Patent Application Publication S52-8854 B and Japanese Unexamined Patent Application Publication H10-195085 A.

Examples of alkoxysilanes having an amino group-containing organic group forming such component include an aminomethyltriethoxysilane, 3-aminopropyltrimethoxysilane, 3-aminopropyltriethoxysilane, 3-aminopropylmethyldimethoxysilane, N-(2-aminoethyl)aminomethyltributoxysilane, N-(2-aminoethyl)-3-aminopropyltrimethoxysilane, N-(2-aminoethyl)-3-aminopropylmethyldimethoxysilane, and 3-anilinopropyltriethoxysilane.

Moreover, examples of epoxy groups containing organoalkoxysilanes may include 3-glycidoxyprolyltrimethoxysilane, 3-glycidoxypropylmethyldimethoxysilane, 2-(3,4-epoxy cyclohexyl)ethyltrimethoxysilane, and 2-(3,4-epoxy cyclohexyl)ethylmethyldimethoxysilane.

The ratio of the alkoxysilane having an amino group containing organic group to the alkoxysilane having an epoxy group containing organic group is, in terms of the molar ratio, preferably within the range of (1:1.5) to (1:5), particularly preferably within the range of (1:2) to (1:4). This component (e1) can be easily synthesized by mixing alkoxysilane having an amino group containing organic group and alkoxysilane having an epoxy group containing organic group as mentioned above to cause them to react at room temperature or by heating.

In particular, when an alkoxysilane having an amino group containing organic group is reacted with an alkoxysilane having an epoxy group containing organic group by the method described in Japanese Unexamined Patent Application H10-195085A, the present invention particularly preferably contains a carbasilatrane derivative obtained by cyclizing by an alcohol exchange reaction and expressed by the general formula:

[Formula 1]

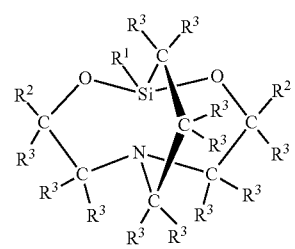

{where $R^1$ is an alkyl group, alkenyl group, or an alkoxy group, and $R^2$ is the same or different group selected from the group consisting of groups expressed by the general formula:

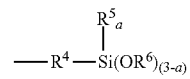

(where $R^4$ is an alkylene group or alkyleneoxyalkylene group, $R^5$ is a monovalent hydrocarbon group, $R^6$ is an alkyl group, and a is 0, 1, or 2), or $R^7$ is an alkylene group, $R^8$ is an alkyl group, alkenyl group, or acyl group, and

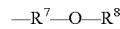

$R^3$ is the same or different hydrogen atom or alkyl group}.

Examples of carbasilatrane derivatives may include carbasilatrane derivatives having a silicon-bonded alkoxy group or a silicon-bonded alkenyl group per molecule represented by the following structure.

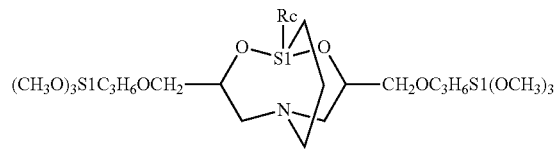

(where Rc is a group selected from methoxy groups, ethoxy groups, vinyl groups, allyl groups and hexenyl groups)

Furthermore, in the present invention, a silatran derivative as represented by the following structural formula may be utilized as an adhesion-imparting agent.

[Formula 4]

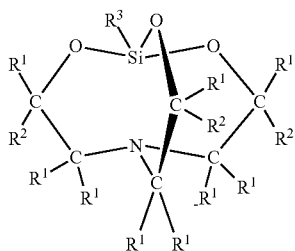

wherein $R^1$ in the formula is the same or a different hydrogen atom or alkyl group, and $R^1$ is particularly preferably a hydrogen atom or a methyl group. Furthermore, $R^2$ in the aforementioned formula is the same or different group selected from a collection consisting of a hydrogen atom, alkyl groups, and organic group containing an alkoxysilyl group as expressed by the general formula:

$$-R^4-Si(OR^6)_xR^6{}_{(3-x)}$$

where at least one of the $R^2$ is the organic group containing an alkoxysilyl group. Examples of the alkyl group of $R^2$ include methyl groups and the like. Furthermore, in the organic group containing an alkoxysilyl group of $R^2$, $R^4$ in the formula is a divalent organic group, and examples include alkylene groups or alkyleneoxyalkylene groups. An ethylene group, a propylene group, a butylene group, a methyleneoxypropylene group, and a methyleneoxypentylene group are particularly preferable. Furthermore, $R^5$ in the formula is an alkyl group having 1 to 10 carbon atoms, and is preferably a methyl group or an ethyl group. Furthermore, $R^6$ in the formula is a substituted or unsubstituted monovalent hydrocarbon group, and preferably a methyl group. Furthermore, x in the formula is 1, 2, or 3, and preferably 3.

Examples of such an organic group containing an alkoxysilyl group of $R^2$ include the following groups.

—$(CH_2)_2Si(OCH_3)_3$—$(CH_2)_2Si(OCH_3)_2CH_3$
—$(CH_2)_3Si(OC_2H_5)_3$—$(CH_2)_3Si(OC_2H_5)(CH_3)_2$
—$CH_2O(CH_2)_3Si(OCH_3)_3$
—$CH_2O(CH_2)_3Si(OC_2H_5)_3$
—$CH_2O(CH_2)_3Si(OCH_3)_2CH_3$
—$CH_2O(CH_2)_3Si(OC_2H_5)_2CH_3$
—$CH_2OCH_2Si(OCH_3)_3$—$CH_2OCH_2Si(OCH_3)(CH_3)_2$ $R^3$ in the above formula is at least one group selected from a group consisting of substituted or unsubstituted monovalent hydrocarbon groups, alkoxy groups having 1 to 10 carbon atoms, glycidoxyalkyl groups, oxiranylalkyl groups, and acyloxyalkyl groups. Examples of the monovalent hydrocarbon group of $R^3$ include methyl groups and other alkyl groups. Examples of the alkoxy group of $R^3$ include methoxy groups, ethoxy groups, and propoxy groups. Examples of the glycidoxyalkyl group of $R^3$ include 3-glycidoxypropyl groups. Examples of the oxiranylalkyl group of $R^3$ include 4-oxiranylbutyl groups and 8-oxiranyl octyl groups. Examples of the acyloxyalkyl group of $R^3$ include acetoxypropyl groups and 3-methacryloxypropyl groups. In particular, $R^3$ is preferably an alkyl group, an alkenyl group, or an alkoxy group, and more preferably an alkyl group or an alkenyl group. Particularly preferred examples include groups selected from methyl groups, vinyl groups, allyl groups, and hexenyl groups.

Furthermore, the composition may contain, as other optional components, heat resistance agents such as iron oxide (red iron oxide), cerium oxide, cerium dimethyl silanolate, fatty acid cerium salt, cerium hydroxide, zirconium compound, and the like; and dyes, pigments other than white, flame retardant agents, and the like may be contained as long as the purpose of the present invention is not impaired.

The composition may be used in the form of granules, pellets, sheets, or films. The pellet shape is obtained by compression molding of the present composition, and is superior in terms of workability and curability. The "pellet" may also be referred to as a "tablet". The shape of the pellet is not restricted, but is usually spherical, elliptical spherical, or cylindrical. The size of the pellet is not restricted, and for example, the pellet has an average particle diameter or a circle equivalent diameter of 500 μm or more. When producing this manner of pellet shaped composition, tableting the granularly formed composition is an efficient production method. If making the composition of the present invention granular is desired, a granular composition can be produced by stirring components (A) to (C) constituting the curable silicone composition of the present invention together with other additives, if any, using the powder mixer described below, and a pellet composition can be produced by tableting the obtained granular composition.

The curable silicone composition of the present invention is a non-flowable solid at 25° C. Here, non-flowability means that the curable silicone composition does not deform and/or flow in the absence of external force, and suitably, the curable silicone composition does not deform and/or flow at 25° C. and in the absence of external force when molded into pellets or tablets. Such non-flowability can be assessed, for example, by placing the molded composition on a hot plate at 25° C. and applying no external force or a certain amount of weight to the composition, and making sure substantial deformation and/or flow of the composition does not occur. If the composition is non-flowable at 25° C., handling even in an uncured state is simple because shape retention of the composition is favorable at that temperature and the surface adhesion thereof is low.

The softening point of the composition is preferably 100° C. or less. Such a softening point means the temperature at which the deformation amount of the composition in the height direction is 1 mm or more when the composition is pressed for 10 seconds from above with a 100 gram load at a height of 2 cm on a hot plate and the deformation of the composition is measured after the load is removed.

The viscosity of the present composition tends to decrease rapidly with an increase in temperature at high temperature and high pressure (in other words, for example, in the manufacturing process of the laminate described above), and is preferably used as a useful melt viscosity value for handling the composition, the value measured under high temperature and high pressure similar to the conditions when the composition is actually used. Therefore, the melt viscosity of the present invention is more preferably measured under high pressure using a Koka-type flow tester (manufactured by the Shimadzu Corporation) than measured with a rotational viscometer such as a rheometer. Specifically, the present composition preferably has a melt viscosity at 150° C. of 200 Pa·s or less and more preferably 150 or less, as measured using a Koka-type flow tester. This is because of the favorable adhesion of the composition to the substrate after hot-melting (in other words, after heating and melting) and cooling to 25° C.

[Manufacturing Method of the Curable Silicone Composition]

The present composition may be produced by powder-mixing components (A) to (C) and possibly any other components at a temperature of less than 50° C., further heating and melting to uniformly mix each component, and then cooling as necessary. However, the composition may be produced by any method, not limited to this method. The powder mixer that can be used in the present manufacturing method is not particularly limited, and examples include a single-shaft or double-shaft continuous mixer, a two-roll mixer, a Ross mixer, a Hobart mixer, a dental mixer, a planetary mixer, a kneader mixer, a Labo Millser (Osaka Chemical Co.), a small grinder, and a Henschel mixer. The Labo Millser and Henschel mixer are preferred.

[Manufacturing Method of the Curable Silicone Sheet]

A hot-meltable curable silicone sheet comprising the present composition may be produced using organopolysiloxane resin microparticles as a raw material (method A), although not limited to the following production methods, or organopolysiloxane resin in solid form at room temperature and optionally in chain form, and may be dispersed in an organic solvent, and the hot-melt solids after removal of the organic solvent may be used as the raw material (hot bulk method) (method B).

Specifically, the former (Method A) contains the following steps:
- Step 1: A step of mixing organopolysiloxane resin microparticles, curing agent, and optionally, in some cases, functional fillers;
- Step 2: A step of kneading the mixture obtained in step 1 while heating and melting at a temperature of 120° C. or lower;
- Step 3: A step wherein the mixture after heating and melting and mixing obtained in Step 2 is laminated between two films, each having at least one release surface, to form a laminate body; and
- Step 4: A step of extending the mixture in the laminate body obtained in Step 3 between rolls to form a curable hot-melt silicone sheet having a specific film thickness.

On the other hand, the latter (Method B) is a process of:
- Step 1: A step of obtaining a hot-melt solid by removing an organic solvent at a temperature of 150° C. or higher from a solution in which an organopolysiloxane resin in a solid state at room temperature and optionally a diorganopolysiloxane in a chain state are dispersed or dissolved in an organic solvent;
- Step 2: A step where after adding all the curing agents to the hot-meltable solids obtained in Step 1, the mixture is kneaded while heating and melting at a temperature below 120° C.;
- Step 3: A step wherein the mixture after heating and melting obtained in Step 2 is laminated between two films, each having at least one release surface, to form a laminate body; and
- Step 4: A step of extending the mixture in the laminate body obtained in Step 3 between rolls to form a curable hot-melt silicone sheet having a specific film thickness.

For example, for either of the manufacturing methods (method A or method B), Step 3 and Step 4 can be continuous and integrated, for example, the mixture after heating and melting obtained in Step 2 is laminated by being discharged or applied between the films having at least one release surface directly under the rolls, and at the same time, the film may be stretched and molded to a specific thickness by adjusting the gap between the rolls. Thus, a manufacturing method having a process in which Step 3 and Step 4 are substantially integrated is also included within the scope of the above manufacturing method.

In other words, Steps 3 and 4 may be carried out in a continuous and integrated manner, for example, a process in which the mixture obtained in Step 2 is discharged or applied between two release films to sandwich the aforementioned mixture between the two release films, such as between two long release films, and a process in which a laminated body comprising the two release films and the aforementioned mixture interposed therebetween is continuously passed between rolls to stretch and form the mixture between the release films to obtain a desired laminated body. Such a method in which Step 3 and Step 4 are performed in an integrated manner is also included in the above-described manufacturing method.

In addition, in the above Step 3 for method A or method B, the process of laminating the mixture after heating and melting between the films is not particularly limited, and may be a process in which
  (i) the mixture after heating and melting from Step 2 is discharged or applied onto a first release film having a release surface, and then a second release film is brought into contact with the surface of the mixture opposite to the surface in contact with the first release film, and the mixture after heating and melting is interposed, or in other words sandwiched, between the first and second release films, or
  (ii) by discharging or applying the mixture after heating and melting from Step 2 between the first release film and the second release film having a peeling surface, the mixture after heating and melting is interposed between the two release films. An example of (ii) is bringing the first and second release films into close proximity by suitable means, such as two rolls, and discharging or coating the mixture from Step 2 at the point where the two release films are brought into close proximity, thereby placing the mixture in the gap between the two release films at the same time or approximately at the same time. It is particularly preferred that the above Steps 3 and 4 are continuous processes.

With respect to these manufacturing methods, the present applicants have proposed the entire process for manufacturing the curable silicone sheet and the manufacturing apparatus used therewith in Japanese Patent Application Nos. 2019-167832 and 2019-167833, and their priority claim applications to Japan. In the present invention, the method and the manufacturing apparatus disclosed therein can also be applied in making a sheet or a film of the curable hot-melt silicone composition.

The type of the film base material used for manufacturing the curable silicone sheet having hot-melt properties is not particularly limited, and polyester film, polyolefin film, polycarbonate film, acrylic film, and the like can be used as appropriate. The sheet-like substrate is preferably non-porous.

The release layer is necessary for easily peeling off the sheet-like material consisting of the curable silicone composition from the film-like substrate, and is sometimes called a release liner, separator, release layer or release coating layer. Suitably, the release layer can be a silicone release agent, a fluorine release agent, an alkyd release agent, a release agent with a release coating function such as a fluorosilicone release agent and the like, or a substrate in and of itself that is difficult for the adhesive material layer to adhere to, made up of the curing reactive silicone composition of the present invention or the cured product thereof. In particular, in the laminated body of the present invention, a release layer obtained by curing a fluorosilicone based release agent is preferably used as the release layer.

The laminate described above can be used, for example, by peeling off the sheet-like member in an uncured state from the film-like substrate after applying the sheet-like member comprising the curable silicone composition to the adherend.

Here, the sheet-like member comprising the curable silicone composition has a thickness of 1 mm or less and may be a film-like adhesive. In other words, the laminate body may and preferably includes a peelable film adhesive retained by a substrate film. Since the film adhesive has hot-melt properties, it may be used as an adhesive for temporary fixing of semiconductor components, and the like, and may be used as a die attach film.

The sheet-like member comprising the curable silicone composition may be molded together with the substrate by compression molding or press molding as-is. Here, the molding may be performed leaving the film-like substrate on one side, and the film may be used as a release film to prevent adhesion to the mold during molding.

[Curable Silicone Sheet]

The curable silicone sheet obtained by the manufacturing method described above is a curable silicone composition containing at least an organopolysiloxane resin, optionally a chain shaped organopolysiloxane and a curing agent, and can further contain a functional filler and other components, has hot-melt properties, and can be used as a heat meltable pressure sensitive adhesive material to form a silicone cured product with excellent heat resistance and stress relief by curing. In particular, the curable silicone sheet has excellent formability, gap fill properties and adhesive/pressure sensitive adhesive strength, and can be used as a die attach film and film adhesive. Furthermore, the sheet can be suitably used as a curable silicone sheet to form a sealing layer by compression molding, press molding, or vacuum lamination. Regardless of the application of use, the curable silicone sheet is a sheet-like product with hot-melt properties, and therefore, the sheet can be preferably applied to adhesion and sealing of large areas.

Specifically, the curable silicone sheet obtained by the manufacturing method as described above, after being peeled from the release film, is arranged on a desired site of a semiconductor or the like, and a film adhesive layer is formed on an adherend utilizing the gap fill properties with regard to unevenness and gaps, and is temporarily secured, arranged, and attached between adherends. Moreover, the curable silicone sheet may be heated to 150° C. or higher to adhere the adherends together by the cured product of the curable silicone sheet. Note that the releasable film may be released after the curable silicone sheet is heated to form a cured product, and this use is preferred when the film is used as a layer to seal a substrate such as a semiconductor or the like. The timing of peeling may be selected based on the application and use of the curable silicone sheet.

The curable silicone sheet is hot-meltable, and therefore, flexibility or fluidity are provided by heating the sheet before final curing. For example, even if the adhering surface of the adherend is uneven, unevenness and gaps can be filled without voids to form an adhesive surface. Examples of heating means of the curable silicone sheet that can be used include various thermostatic baths, hot plates, electromagnetic heating devices, heating rollers, and the like. In order to perform more efficient adhering and heating, for example, an electric heat pressing machine, a diaphragm type laminator, a roller laminator, or the like is preferably used.

As described above, the curable silicone sheet according to the present invention has superior gap fill properties at the time of melting and flexibility of the cured product at room temperature to high temperature, and therefore, the cured product can be very suitably used in a molding method including a coating process in which overmolding and underfilling of a semiconductor device including optical semiconductors are performed at the same time (so-called mold underfilling method). Furthermore, due to the characteristics described above, the composition can be suitably used in a molding method including a coating process (so-called wafer molding) in which the surface of a semiconductor wafer substrate on which a single or a plurality of semiconductor devices are mounted is covered and overmolded so that the gaps between the semiconductor devices are filled with the cured product.

In the above steps, a compression molding machine, an injection molding machine, an auxiliary ram molding machine, a slide molding machine, a double ram molding machine, a low pressure sealing molding machine, a heat press, a vacuum laminator, or the like can be used. In particular, the curable silicone sheet of the present invention can be preferably used to obtain a cured product by press molding, compression molding, and vacuum lamination.

An optimum temperature can be selected as a condition for heat curing the curable silicone sheet based on a curing system thereof. In the case of hydrosilylation reaction, the temperature is preferably 150° C. or higher, and in the case of organic peroxide curing, the temperature is preferably 170° C. or higher.

Since the cured product is suitable as a protective member for a semiconductor or the like, the cured product obtained by curing the curable silicone sheet according to the present invention preferably has a type-D durometer hardness of 20 or more at 25° C. This type-D durometer hardness is determined by the type-D durometer in accordance with the JIS K 6253-1997 "Hardness Testing Methods for Vulcanized Rubber and Thermoplastic Rubber."

Furthermore, since the cured product is suitable as an encapsulant for semiconductors in flexible applications requiring flexibility, the flexural elongation of the cured product measured by the method specified in JIS K 6911-1995 "General Test Method for Thermosetting Plastics" should be 2% or more, or preferably 4% or more.

[Application of Curable Silicone Sheet of Present Invention]

The curable silicone sheet according to the present invention has hot-melt properties, gap fill properties while melted (hot-melt), and has superior workability and curability, and is therefore preferable as an encapsulant or underfill agent for semiconductors; encapsulant or underfill agent for power semiconductors such as SiC, GaN, and the like; encapsulant or light reflecting material for optical semiconductors such as light emitting diodes, photodiodes, phototransistors, laser diodes, and the like; electrical and electronic adhesive, potting agent, protecting agent, and coating agent. Since the composition has hot-melt properties, the composition is also suitable as a material for press molding, compression molding, or molding by vacuum lamination. In particular, the composition is suitable for use as an encapsulant for semiconductors that use the mold underfill method or the wafer molding method during molding.

In particular, the curable silicone sheets according to the present invention can be used for sealing a large area of a semiconductor substrate (including wafers and optical semiconductor substrates). Furthermore, a sheet formed from the curable silicone composition of the present invention can be used for die attach films, sealing a flexible device, stress relief layers for bonding two different substrates (such as a panel with a large surface substrate or a panel with a panel), and the like.

[Application of Cured Product of Curable Silicone Sheet of Present Invention]

Although the applications of the cured product of the present invention are not particularly limited, the composition of the present invention has hot-melt properties, superior moldability and gap fill properties, and the cured product has the flexibility described above at room temperature, high stress relief properties, and flexural elongation. Therefore, the cured product obtained by curing the present composition can be suitably used as a member for a semiconductor device, and can be suitably used as an encapsulant for a semiconductor element including optical semiconductors, an IC chip or the like, a light reflection material for an optical semiconductor device, as an adhesive/bonding member of a semiconductor device, and as an adhesive/bonding member of a display panel.

The semiconductor device equipped with a member made up of the cured product is not particularly limited, but is particularly preferred to be a power semiconductor device, an optical semiconductor device, or a semiconductor device mounted on a flexible circuit base.

[Method of Molding Cured Product]

The composition can be cured by a method comprising at least the following steps (I) to (III).

(I) a step of heating to a temperature of 100° C. or higher to melt the present composition;
(II) a step of injecting the curable silicone composition obtained in step (I) into a mold or a step of distributing the curable silicone composition obtained in step (I) to a mold by clamping; and
(III) a step of curing the curable silicone composition injected in step (II).

In the above steps, a transfer molding machine, a compression molding machine, an injection molding machine, an auxiliary ram molding machine, a slide molding machine, a double ram molding machine, a low pressure sealing molding machine, a vacuum laminator, or the like can be used. In particular, the composition of the present invention can be suitably used for the purpose of obtaining a cured product by transfer molding, compression molding, press molding, or vacuum laminating.

Finally, in step (III), the curable silicone composition injected (applied) in step (II) is cured. In the case where (c1) organic peroxide is used as component (C), the heating temperature is preferably 150° C. or higher or 170° C. or higher, and in the case where (c2), organohydrogenpolysiloxane having at least two silicon-bonded hydrogen atoms in a molecule and a hydrosilylation reaction catalyst is used, the heating temperature is preferably 100° C. or higher or 130° C. or higher.

EXAMPLES

The hot-melt curable silicone composition of the present invention and manufacturing method thereof are described in detail by means of examples and comparative examples. Note that in the formulas, Me and Vi represent a methyl group and a vinyl group, respectively. The softening points of the curable silicone compositions of each example and comparative example were measured by the following methods. The curable silicone composition was heated at 150° C. for 2 hours to produce a cured product, and the elastic modulus (initially and after leaving for 1,000 hours at 150° C.) were measured using the following methods. The results are shown in Table 1.

[Softening Point]

The curable silicone composition was molded into cylindrical pellets of φ14 mm*22 mm. A pellet was placed on a hot plate set at 25° C. to 100° C. and continuously pressed from above for 10 seconds with a load of 100 grams, and after the load was removed, the amount of deformation of the pellet was measured. The temperature at which the deformation amount in the height direction was 1 mm or more was defined as the softening point.

[Storage Elastic Modulus]

The curable silicone composition was heated at 150° C. for 2 hours to prepare a cured product (initial cured product). The cured product was left in an oven set at 150° C. for 1,000 hours to produce an aged cured product. The storage modulus of these cured products from −50° C. to 250° C. was measured using a rheometer ARES (manufactured by TA Instruments Japan Inc.) and the values at 25° C. were read. Table 1 shows the values measured at 25° C.

Organopolysiloxane resins containing a hydrosilylation reaction catalyst were prepared using the methods shown in Reference Examples 1 and 2 below, and the hot-melt properties were evaluated based on the presence or absence of softening point/melt viscosity. Said organopolysiloxane resin microparticles were prepared by the method shown in Examples 3 to 10, and the loss on heating (or mass loss rate) thereof was evaluated. In the reference examples, the 1,1, 3,3-tetramethyl-1,3-divinyl disiloxane used for the platinum complex that is the hydrosilylation reaction catalyst is described as "1,3-divinyltetramethyldisiloxane."

Reference Example 1

270.5 g of an Organopolysiloxane 55% by mass xylene solution represented by the average unit formula: $(Me_2ViSiO_{1/2})_{0.05}(Me_3SiO_{1/2})_{0.39}(SiO_{4/2})_{0.56}(HO_{1/2})_{0.02}$ as well as 0.375 g of platinum 1,3-divinyltetramethyldisiloxane complex 1,3-divinyltetramethyldisiloxane solution (platinum metal content=approximately 4,000 ppm) were introduced into a 1 L flask in white solid form at 25° C. and were stirred to uniformity at room temperature (25° C.) to prepare an organopolysiloxane resin (1) xylene solution containing 10 ppm in terms of mass units as platinum metal. In addition, the organopolysiloxane resin (1) did not soften/melt even when heated to 200° C. and did not have hot-melt properties.

Reference Example 2

A xylene solution of a resinous organopolysiloxane (2) containing 10 ppm of platinum metal in mass units was prepared by introducing 270.5 g of a 55% by mass xylene solution of a resinous organopolysiloxane represented by the average unit formula: $(Me_3SiO_{1/2})_{0.44}(SiO_{4/2})_{0.56}(HO_{1/2})_{0.02}$ which is a white solid at 25° C., and 0.375 g of a 1,3-divinyltetramethyldisiloxane solution of platinum 1,3-divinyltetramethyldisiloxane complex (platinum metal content=approximately 4,000 ppm) into a 1 L flask and stirring until uniform at room temperature (25° C.).

In addition, the organopolysiloxane resin (2) did not soften/melt even when heated to 200° C. and did not have hot-melt properties.

Reference Example 3: Non-Hot-Melt Organopolysiloxane Resin Microparticles (1)

A xylene solution of the organopolysiloxane resin (1) prepared in Reference Example 1 was converted into particles while removing the xylene by a spray method using a spray dryer at 50° C. Thus, spherical, non-hot-melt organopolysiloxane resin microparticles (1) were prepared. Observation of the microparticles with an optical microscope revealed that the particle diameter was 5 to 10 µm and the average particle diameter was 6.9 µm. The microparticles were exposed to 200° C. for 1 hour, and the loss on heating was 4.7 wt %.

Reference Example 4: Non-Hot-Melt Organopolysiloxane Resin Microparticles (2)

The organopolysiloxane resin microparticles prepared in Reference Example 3 were aged in an oven set at 120° C. for 4 hours to prepare regular spherical shape, non-hot-melt organopolysiloxane resin microparticles (2). The particles were observed by optical microscopy and their diameter was 5 to 10 µm, and no agglomeration was observed due to aging. The microparticles were exposed to 200° C. for 1 hour, and the loss on heating was 2.3 wt %.

Reference Example 5: Non-Hot-Melt Organopolysiloxane Resin Microparticles (3)

The organopolysiloxane resin microparticles prepared in Reference Example 3 were aged in an oven set at 120° C. for 8 hours to prepare regular spherical shape, non-hot-melt organopolysiloxane resin microparticles (3). The particles were observed by optical microscopy and their diameter was 5 to 10 µm, and no agglomeration was observed due to aging. The microparticles were exposed to 200° C. for 1 hour, and the loss on heating was 1.3 wt %.

Reference Example 6: Non-Hot-Melt Organopolysiloxane Resin Microparticles (4)

The organopolysiloxane resin microparticles prepared in Reference Example 3 were aged in an oven set at 120° C. for 24 hours to prepare regular spherical shape, non-hot-melt organopolysiloxane resin microparticles (4). The particles were observed by optical microscopy and their diameter was 5 to 10 µm, and no agglomeration was observed due to aging. The microparticles were exposed to 200° C. for 1 hour, and the loss on heating was 0.7 wt %.

Reference Example 7: Non-Hot-Melt Organopolysiloxane Resin Microparticles (5)

A xylene solution of the organopolysiloxane resin (2) prepared in Reference Example 2 was converted into particles while removing the xylene by a spray method using a spray dryer at 50° C. Thus, regular spherical shape, non-hot-melt organopolysiloxane resin microparticles (5) were prepared. Observation of the microparticles with an optical microscope revealed that the particle diameter was 5 to 10 µm and the average particle diameter was 7.4 µm. The microparticles were exposed to 200° C. for 1 hour, and the loss on heating was 4.8 wt %.

Reference Example 8: Non-Hot-Melt Organopolysiloxane Resin Microparticles (6)

The organopolysiloxane resin microparticles prepared in Reference Example 7 were aged in an oven set at 120° C. for 4 hours to prepare regular spherical shape, non-hot-melt organopolysiloxane resin microparticles (2). The particles were observed by optical microscopy and their diameter was 5 to 10 µm, and no agglomeration was observed due to aging. The microparticles were exposed to 200° C. for 1 hour, and the loss on heating was 2.1 wt %.

Reference Example 9: Non-Hot-Melt Organopolysiloxane Resin Microparticles (7)

The organopolysiloxane resin microparticles prepared in Reference Example 7 were aged in an oven set at 120° C. for 8 hours to prepare regular spherical shape, non-hot-melt organopolysiloxane resin microparticles (7). The particles were observed by optical microscopy and their diameter was 5 to 10 µm, and no agglomeration was observed due to aging. The microparticles were exposed to 200° C. for 1 hour, and the loss on heating was 1.2 wt %.

Reference Example 10: Non-Hot-Melt Organopolysiloxane Resin Microparticles (8)

The organopolysiloxane resin microparticles prepared in Reference Example 7 were aged in an oven set at 120° C. for 24 hours to prepare regular spherical shape, non-hot-melt organopolysiloxane resin microparticles (8). The particles were observed by optical microscopy and their diameter was 5 to 10 µm, and no agglomeration was observed due to aging. The microparticles were exposed to 200° C. for 1 hour, and the loss on heating was 0.8 wt %.

Example 1

67.0 g of non-hot-meltable organopolysiloxane resin microparticles (7) (vinyl group content=0 mass %);

33.0 g of dimethylpolysiloxane capped at both molecular terminals with dimethylvinylsiloxy groups represented by the formula: $ViMe_2SiO(Me_2SiO)_{800}SiViMe_2$ (vinyl group content=0.09 mass %);

0.21 g of organohydrogenpolysiloxane expressed by the formula:

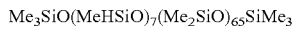

$Me_3SiO(MeHSiO)_7(Me_2SiO)_{65}SiMe_3$

{an amount such that the silicon-bonded hydrogen atoms in the organohydrogenpolysiloxane is 1.3 mol relative to 1 mol of vinyl groups in the dimethylpolysiloxane capped at both molecular terminals with dimethylvinylsiloxy groups};

234.4 g of alumina (AES-12 manufactured by Sumitomo Chemical) having an average particle size of 0.44 µm; and 1-ethynyl-1-cyclohexanol (amount to make 1,000 ppm in mass units relative to this composition) were batch fed into a small grinder and stirred for 1 minute at room temperature (25° C.) to prepare a uniform curable granular silicone composition. The measurement results of the softening point and other properties of this composition are shown in Table 1.

Example 2

63.3 g of non-hot-meltable organopolysiloxane resin microparticles (7) (vinyl group content=0 mass %);

3.5 g of non-hot-meltable organopolysiloxane resin microparticles (3) (vinyl group content=1.91 mass %);

33.2 g of dimethylpolysiloxane capped at both molecular terminals with dimethylvinylsiloxy groups represented by the formula: $ViMe_2SiO(Me_2SiO)_{800}SiViMe_2$ (vinyl group content=0.09 mass %);

0.6 g of organohydrogenpolysiloxane expressed by the formula:

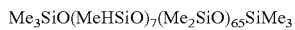

$Me_3SiO(MeHSiO)_7(Me_2SiO)_{65}SiMe_3$

{an amount such that the silicon-bonded hydrogen atom in the organohydrogenpolysiloxane resin is 1.2 mol relative to 1 mol of vinyl groups in the organopolysiloxane resin microparticle particles (3) and dimethylpolysiloxane capped at both molecular terminals with dimethylvinylsiloxy groups};

218.4 g of alumina (AES-12 manufactured by Sumitomo Chemical) having an average particle size of 0.44 μm; and 1-ethynyl-1-cyclohexanol (amount to make 1,000 ppm in mass units relative to this composition)

were batch fed into a small grinder and stirred for 1 minute at room temperature (25° C.) to prepare a uniform curable granular silicone composition. The measurement results of the softening point and other properties of this composition are shown in Table 1.

Example 3

60.2 g of non-hot-meltable organopolysiloxane resin microparticles (8) (vinyl group content=0 mass %);

7.0 g of non-hot-meltable organopolysiloxane resin microparticles (4) (vinyl group content=1.91 mass %);

32.8 g of dimethylpolysiloxane capped at both molecular terminals with dimethylvinylsiloxy groups represented by the formula: $ViMe_2SiO(Me_2SiO)_{800}SiViMe_2$ (vinyl group content=0.09% by mass);

0.65 g of organohydrogenpolysiloxane resin represented by the formula:

$(HMe_2SiO_{1/2})_{0.67}(SiO_{4/2})_{0.33}$ (silicon-bonded hydrogen atom content=0.95% by mass)

{amount such that the silicon-bonded hydrogen atom in the organohydrogenpolysiloxane resin is 1.0 mol relative to 1 mol of vinyl groups in the organopolysiloxane resin microparticle particles (4) and dimethylpolysiloxane capped at both molecular terminals with dimethylvinylsiloxy groups};

273.0 g of alumina (AES-12 manufactured by Sumitomo Chemical) having an average particle size of 0.44 μm; and 1-ethynyl-1-cyclohexanol (amount to make 1,000 ppm in mass units relative to this composition)

were batch fed into a small grinder and stirred for 1 minute at room temperature (25° C.) to prepare a uniform curable granular silicone composition. The measurement results of the softening point and other properties of this composition are shown in Table 1.

Example 4

56.4 g of non-hot-meltable organopolysiloxane resin microparticles (8) (vinyl group content=0 mass %);

10.3 g of non-hot-meltable organopolysiloxane resin microparticles (4) (vinyl group content=1.91 mass %);

33.3 g of dimethylpolysiloxane capped at both molecular terminals with dimethylvinylsiloxy groups represented by the formula: $ViMe_2SiO(Me_2SiO)_{800}SiViMe_2$ (vinyl group content=0.09% by mass);

1.57 g of organohydrogenpolysiloxane expressed by the formula:

$Me_3SiO(MeHSiO)_7(Me_2SiO)_{6.5}SiMe_3$

{an amount such that the silicon-bonded hydrogen atom in the organohydrogenpolysiloxane resin is 1.3 mol relative to 1 mol of vinyl groups in the organopolysiloxane resin microparticle particles (4) and dimethylpolysiloxane capped at both molecular terminals with dimethylvinylsiloxy groups};

203.1 g of alumina (AES-12 manufactured by Sumitomo Chemical) having an average particle size of 0.44 μm; and 1-ethynyl-1-cyclohexanol (amount to make 1,000 ppm in mass units relative to this composition) were batch fed into a small grinder and stirred for 1 minute at room temperature (25° C.) to prepare a uniform curable granular silicone composition. The measurement results of the softening point and other properties of this composition are shown in Table 1.

Example 5

30.5 g of non-hot-meltable organopolysiloxane resin microparticles (8) (vinyl group content=0 mass %);

32.5 g of non-hot-meltable organopolysiloxane resin microparticles (4) (vinyl group content=1.91 mass %);

30.0 g of dimethylpolysiloxane capped at both molecular terminals with dimethylvinylsiloxy groups represented by the formula: $ViMe_2SiO(Me_2SiO)_{800}SiViMe_2$ (vinyl group content=0.09% by mass);

2.0 g of organohydrogenpolysiloxane expressed by the formula:

$Me_3SiO(MeHSiO)_7(Me_2SiO)_{65}SiMe_3$;

5.0 g of organohydrogenpolysiloxane represented by the formula:

$HMe_2SiO(Me_2SiO)_{17}SiMe_2H$

{an amount such that the silicon-bonded hydrogen atom in the two organohydrogenpolysiloxane resins is 0.9 mol relative to 1 mol of vinyl groups in the organopolysiloxane resin microparticle particles (4) and dimethylpolysiloxane capped at both molecular terminals with dimethylvinylsiloxy groups};

1-ethynyl-1-cyclohexanol (amount to make 1,000 ppm in mass units relative to this composition) were batch fed into a small grinder and stirred for 1 minute at room temperature (25° C.) to prepare a uniform curable granular silicone composition. The measurement results of the softening point and other properties of this composition are shown in Table 1.

Comparative Example 1

69.8 g of non-hot-meltable organopolysiloxane resin microparticles (5) (vinyl group content=0 mass %);

29.9 g of dimethylpolysiloxane capped at both molecular terminals with dimethylvinylsiloxy groups represented by the formula: $ViMe_2SiO(Me_2SiO)_{800}SiViMe_2$ (vinyl group content=0.09% by mass);

0.2 g of organohydrogenpolysiloxane expressed by the formula:

$Me_3SiO(MeHSiO)_7(Me_2SiO)_{65}SiMe_3$;

{an amount such that the silicon-bonded hydrogen atoms in the organohydrogenpolysiloxane resin is 1.4 mol relative to 1 mol of vinyl groups in the dimethylpolysiloxane capped at both molecular terminals with dimethylvinylsiloxy groups};

234.4 g of alumina (AES-12 manufactured by Sumitomo Chemical) having an average particle size of 0.44 μm; and 1-ethynyl-1-cyclohexanol (amount to make 1,000 ppm in mass units relative to this composition)

were batch fed into a small grinder and stirred for 1 minute at room temperature (25° C.) to prepare a uniform curable granular silicone composition. The measurement results of the softening point and other properties of this composition are shown in Table 1.

Comparative Example 2

66.0 g of non-hot-meltable organopolysiloxane resin microparticles (5) (vinyl group content=0 mass %);
3.0 g of non-hot-meltable organopolysiloxane resin microparticles (1) (vinyl group content=1.91 mass %);
29.8 g of dimethylpolysiloxane capped at both molecular terminals with dimethylvinylsiloxy groups represented by the formula: $ViMe_2SiO(Me_2SiO)_{800}SiViMe_2$ (vinyl group content=0.09% by mass);
0.6 g of organohydrogenpolysiloxane expressed by the formula:

$Me_3SiO(MeHSiO)_7(Me_2SiO)_{65}SiMe_3$

{an amount such that the silicon-bonded hydrogen atom in the organohydrogenpolysiloxane resin is 1.2 mol relative to 1 mol of vinyl groups in the organopolysiloxane resin microparticle particles (1) and dimethylpolysiloxane capped at both molecular terminals with dimethylvinylsiloxy groups};
218.4 g of alumina (AES-12 manufactured by Sumitomo Chemical) having an average particle size of 0.44 μm; and
1-ethynyl-1-cyclohexanol (amount to make 1,000 ppm in mass units relative to this composition)
were batch fed into a small grinder and stirred for 1 minute at room temperature (25° C.) to prepare a uniform curable granular silicone composition. The measurement results of the softening point and other properties of this composition are shown in Table 1.

Comparative Example 3

62.5 g of non-hot-meltable organopolysiloxane resin microparticles (6) (vinyl group content=0 mass %);
7.0 g of non-hot-meltable organopolysiloxane resin microparticles (2) (vinyl group content=1.91 mass %);
29.8 g of dimethylpolysiloxane capped at both molecular terminals with dimethylvinylsiloxy groups represented by the formula: $ViMe_2SiO(Me_2SiO)_{800}SiViMe_2$ (vinyl group content=0.44 mass %);
0.65 g of organohydrogenpolysiloxane resin represented by the formula:

$(HMe_2SiO_{1/2})_{0.67}(SiO_{4/2})_{0.33}$ (silicon-bonded hydrogen atom content=0.95% by mass)

{an amount such that the silicon-bonded hydrogen atom in the organohydrogenpolysiloxane resin is 1.0 mol relative to 1 mol of vinyl groups in the organopolysiloxane resin microparticle particles (2) and dimethylpolysiloxane capped at both molecular terminals with dimethylvinylsiloxy groups};
273.0 g of alumina (AES-12 manufactured by Sumitomo Chemical) having an average particle size of 0.44 μm; and
1-ethynyl-1-cyclohexanol (amount to make 1,000 ppm in mass units relative to this composition)
were batch fed into a small grinder and stirred for 1 minute at room temperature (25° C.) to prepare a uniform curable granular silicone composition. The measurement results of the softening point and other properties of this composition are shown in Table 1.

Comparative Example 4

32.5 g of non-hot-meltable organopolysiloxane resin microparticles (5) (vinyl group content=0 mass %);
32.5 g of non-hot-meltable organopolysiloxane resin microparticles (1) (vinyl group content=1.91 mass %);
28.0 g of dimethylpolysiloxane capped at both molecular terminals with dimethylvinylsiloxy groups represented by the formula: $ViMe_2SiO(Me_2SiO)_{800}SiViMe_2$ (vinyl group content=0.09 mass %);
2.0 g of organohydrogenpolysiloxane expressed by the formula:

$Me_3SiO(MeHSiO)_7(Me_2SiO)_{6.5}SiMe_3$, 5.0 g of organohydrogenpolysiloxane represented by the formula:

$HMe_2SiO(Me_2SiO)_{17}SiMe_2H$

{an amount such that the silicon-bonded hydrogen atom in the two organohydrogenpolysiloxane resins is 0.9 mol relative to 1 mol of vinyl groups in the organopolysiloxane resin microparticle particles (1) and dimethylpolysiloxane capped at both molecular terminals with dimethylvinylsiloxy groups};
1-ethynyl-1-cyclohexanol (amount to make 1,000 ppm in mass units relative to this composition)
were batch fed into a small grinder and stirred for 1 minute at room temperature (25° C.) to prepare a uniform curable granular silicone composition. The measurement results of the softening point and other properties of this composition are shown in Table 1.

TABLE 1

|  | Examples | | | | | Comparative Examples | | | |
|---|---|---|---|---|---|---|---|---|---|
|  | 1 | 2 | 3 | 4 | 5 | 1 | 2 | 3 | 4 |
| Organopolysiloxane resin microparticle No./g | (7) 67.0 | (7) 63.3 | (8) 60.2 | (8) 56.4 | (8) 30.5 | (5) 69.8 | (5) 66.0 | (8) 62.5 | (5) 32.5 |
| Weight loss ratio mass % | 1.2 | 1.2 | 0.8 | 0.8 | 0.8 | 4.8 | 4.8 | 2.1 | 4.8 |
| Organopolysiloxane resin microparticle No./g | — | (3) 3.5 | (4) 7.0 | (4) 10.3 | (4) 32.5 | — | (1) 3.0 | (2) 3.0 | (1) 32.5 |
| Weight loss ratio mass % | — | 1.3 | 0.7 | 0.7 | 0.7 | — | 4.7 | 2.3 | 4.7 |

TABLE 1-continued

|  | Examples | | | | | Comparative Examples | | | |
| --- | --- | --- | --- | --- | --- | --- | --- | --- | --- |
|  | 1 | 2 | 3 | 4 | 5 | 1 | 2 | 3 | 4 |
| Softening point (° C.) | 80 | 85 | 85 | 80 | 60 | 80 | 80 | 85 | 60 |
| Storage modulus (initial) @25 C. [MPa] | 170 | 165 | 160 | 170 | 50 | 150 | 145 | 150 | 45 |
| Storage Modulus (after 150 C./1,000 h) @25 C. [MPa] | 210 | 220 | 170 | 190 | 65 | 380 | 420 | 260 | 220 |

SUMMARY

The curable silicone compositions of Examples 1 to 5 of the present invention are hot-melt compositions having a softening point at or below 100° C., using an organopolysiloxane resin having a weight loss of 2.0 mass %, and the cured products thereof did not show a remarkable increase in storage elastic modulus even after being left at 150° C. for 1,000 hours. From this, it was recognized that the cured product obtained by using the compositions in each example tended to suppress hardening and to maintain flexibility at high temperature storage. The compositions are therefore considered to be particularly suitable for applications where they are integrally molded with a substrate and used at high temperatures.

On the other hand, in Comparative Examples 1 to 4, the weight loss of the organopolysiloxane resin component after being left at 200° C. for 1 hour was more than 2 mass %, and all of the Comparative Examples give cured products having a softening point and an initial storage modulus similar to those of the Examples, but when the obtained cured products are left at 150° C. for 1,000 hours, a remarkable increase in the storage elastic modulus was observed. It was observed that the compositions in the comparative experiments tended to harden and become brittle due to high temperature storage.

Manufacturing Example 1

The granular curable silicone composition, such as Example 1 above, was heated to 80° C., heated and melted using a twin-screw extruder, and kneaded in the form of a semi-solid softened material, and then fed onto a release film (FL2-01 manufactured by Takara Inc.) at a feed rate of 5 kg/hour and laminated between the two release films. The laminate body was then stretched between rolls to form a laminate body in which a hot-melt curable silicone sheet having a thickness of 500 µm is laminated between two peelable films, and the entire laminate body was cooled by a cooling roll set at −15° C. In said laminate body, a flat and homogenous hot-meltable curable silicone sheet was obtained by separating the release film.

Manufacturing Example 2

The granular curable silicone compositions of Example 1 and the like described above were heated to 80° C., melted and kneaded using a twin-screw extruder, and formed into a sheet shape using a T-type die (opening dimensions: 800 µm×100 mm, heated to 80° C.), and then fed onto a release film (FL2-01 manufactured by Takara Inc.) at a feed rate of 5 kg/hour. The entire sheet was cooled by a cooling roll set at −15° C., and then laminated between the two release films. The laminate body was then stretched between rolls to form a laminate body in which a hot-melt curable silicone sheet having a thickness of 500 µm is laminated between two peelable films. In said laminate body, a flat and homogenous hot-meltable curable silicone sheet was obtained by separating the release film.

Manufacturing Example 3

3.76 kg of organopolysiloxane resin that is a white solid at 25*C represented by the average unit formula: (Me$_2$ViSiO$_{1/2}$)$_{0.05}$(Me$_3$SiO$_{1/2}$)$_{0.39}$(SiO$_{4/2}$)$_{0.56}$(HO$_{1/2}$)$_{0.02}$ (vinyl group content=1.9 mass %); 3.08 kg of organopolysiloxane resin that is a white solid at 25° C. expressed by the average unit formula: (Me$_3$SiO$_{1/2}$)$_{0.44}$(SiO$_{4/2}$)$_{0.56}$(HO$_{1/2}$)$_{0.02}$ (vinyl group content=0 mass %); and 2.56 kg of dimethylpolysiloxane capped at both molecular terminals with dimethylvinylsiloxy groups expressed by the formula:

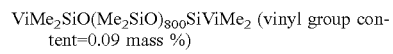

ViMe$_2$SiO(Me$_2$SiO)$_{800}$SiViMe$_2$ (vinyl group content=0.09 mass %)

were dissolved in 4.00 kg of xylene in a pail using a three-one motor. The resulting solution was fed into a twin-screw extruder with the maximum attainable temperature set at 230° C. The xylene and low molecular weight organopolysiloxane components were removed under a vacuum of −0.08 MPa, resulting in a hot-melt transparent mixture 1. The mixture 1 was placed in a pail and cooled to a solid state. The amount of volatile components in this mixture based on conditions of 200° C. for 1 hour were measured and was 0.7 mass %.

The resulting hot-melt mixture 1 was then fed into a twin-screw extruder at 170° C. by a hot melter (Nordson VersaPail Metter) for cylindrical pails at 9.67 kg/hr from line 1 as illustrated in FIG. 1.

Next, a mixture made up of:
0.500 kg/hr of organohydrogenpolysiloxane represented by the formula:

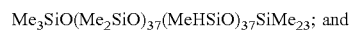

Me$_3$SiO(Me$_2$SiO)$_{37}$(MeHSiO)$_{37}$SiMe$_{23}$; and

1-Ethynyl-1-cyclohexanol In an amount equivalent to 500 ppm of this composition as a whole were fed from the line 3-b as illustrated in FIG. 1.

The set temperature of the feed section was 150° C.
Then, a mixture made up of:
0.15 kg/hr of dimethylpolysiloxane capped at both molecular terminals with dimethylvinylsiloxy groups expressed by the formula: ViMe$_2$SiO(Me$_2$SiO)$_{800}$SiViMe$_2$ (vinyl group content=0.09%); and a 1,3-divinyl-tetramethyldisiloxane platinum complex 1,3-divinyl-tetramethyldisiloxane solution (an amount where platinum metal is 4.0 ppm in terms of mass units with respect to this composition as a whole)

were fed from the line 3-a as illustrated in FIG. 1 (the set temperature of the feed section was 80° C.), and deaeration and melt mixing was performed under a vacuum of −0.08 MPa in the extruder.

The outlet temperature of the twin-screw extruder was set at 80° C., the mixture was in the form of a semi-solid softened material, and a 330 mm wide, 125 μm thick release film (FL2-01, manufactured by Takara Inc.) was supplied at a speed of 1.0 m/min, the mixture was fed onto the film at 5 kg/hr so as to make the feed rate 5 kg/hr, and the mixture was sandwiched between the two release films to form a laminate. Subsequently, the laminate was then stretched by pressurizing the mixture between rolls whose temperature was controlled at 90° C. to form a laminate in which a curable hot-melt silicone composition sheet having a thickness of 300 μm was laminated between two release films, followed by cooling the entire laminate by air cooling. The configuration of the manufacturing device is illustrated in FIG. 1. When the release film was peeled off from the obtained laminate, a flat, homogeneous, tack-free, transparent curable hot-melt silicone composition sheet without bubbles was obtained, and the softening temperature thereof was 80° C.

REFERENCE NUMERALS

FIG. 1
1: Hot melter
2: Extruder
3-$a$: Pump
3-$b$: Pump
3-$c$: Vacuum pump
4-$a$: Release sheet
4-$b$: Release sheet
5-$a$: Stretching roller (optionally further equipped with a temperature control function)
5-$b$: Stretching roller (optionally further equipped with a temperature control function)
6: Cooling roller
7: Film thickness meter
8: Sheet cutter
9: Foreign material inspecting machine

The invention claimed is:

1. A curable silicone composition having hot-melt properties, comprising:
(A) 100 mass parts of an organopolysiloxane resin component containing component (A1) and component (A2) at a mass ratio of 0:100 to 90:10, and the mass loss when component (A1) and component (A2) are exposed for 1 hour at 200° C. is 2.0 mass % or less;
(A1) an organopolysiloxane resin that does not have hot-melt properties as a whole molecule, has a curing reactive functional group containing a carbon-carbon double bond in the molecule, and where 40 to 90 mol % of the total siloxane units of the organopolysiloxane resin are siloxane units represented by $SiO_{4/2}$;
(A2) an organopolysiloxane resin that does not have hot-melt properties as a whole molecule, does not have a curing reactive functional group containing a carbon-carbon double bond in the molecule, and where 40 to 90 mol % of the total siloxane units of the organopolysiloxane resin are siloxane units represented by $SiO_{4/2}$;
(B) 10 to 100 mass parts of a straight or branched chain organopolysiloxane, liquid or solid at 25° C., having at least two curing reactive functional groups containing a carbon-carbon double bond in the molecule; and
(C) one or more curing agents selected from (c1) or (c2) below, in an amount necessary to cure the composition:
(c1) an organic peroxide,
(c2) an organohydrogenpolysiloxane having at least two silicon-bonded hydrogen atoms in the molecule and a hydrosilylation reaction catalyst.

2. The curable silicone composition according to claim 1, further comprising (D) a functional filler, and wherein the amount of component (D) is within the range of 10 to 2,000 mass parts relative to 100 mass parts of the sum of component (A) and component (B).

3. The curable silicone composition according to claim 1, wherein:
component (A1) is an organopolysiloxane resin (A1-1) not having hot-melt properties and represented by the following average unit formula:

$$(R^1{}_3SiO_{1/2})_a(R^1{}_2SiO_{2/2})_b(R^1SiO_{3/2})_c(SiO_{4/2})_d(R^2O_{1/2})_e$$

where each R1 is an independent monovalent hydrocarbon group having 1 to 10 carbon atoms, provided that, 1 to 12 mol % of all $R^1$ in the molecule is an alkenyl group; each $R^2$ is a hydrogen atom or an alkyl group having 1 to 10 carbon atoms; and a, b, c, d, and e are numbers satisfying the following: $0.10 \le a \le 0.60$, $0 \le b \le 0.70$, $0 \le c \le 0.80$, $0.4 \le d \le 0.65$, $0 \le e \le 0.05$, $0.4 \le (c+d)$, and $(a+b+c+d)=1$;
component (A2) is a non-hot-meltable organopolysiloxane resin (A2-1) represented by the following average unit formula:

$$(R^3{}_3SiO_{1/2})_f(R^3{}_2SiO_{2/2})_g(R^3SiO_{3/2})_h(SiO_{4/2})_i(R^2O_{1/2})_j$$

where each $R^3$ is independently a monovalent hydrocarbon group having 1 to 10 carbon atoms and not containing a carbon-carbon double bond; $R^2$ is a hydrogen atom or an alkyl group having 1 to 10 carbon atoms; and f, g, h, i, and j are numbers satisfying the following: $0.35 \le f \le 0.55$, $0 \le g \le 0.20$, $0 \le h \le 0.20$, $0.45 \le i \le 0.65$, $0 \le j \le 0.05$, and $(f+g+h+i)=1$;
component (B) is a straight-chain diorganopolysiloxane (B1) represented by the following structural formula:

$$R^4{}_3SiO(SiR^4{}_2O)_kSiR^4{}_3$$

where each $R^4$ is independently a monovalent hydrocarbon group having 1 to 10 carbon atoms, provided that at least two of the $R^4$ in the molecule are alkenyl groups, and k is a number from 20 to 5,000.

4. The curable silicone composition according to claim 1, wherein component (A1) and component (A2) are spherical organopolysiloxane resin microparticles having an average primary particle diameter of 1 to 20 μm.

5. The curable silicone composition according to claim 1, wherein component (C) at least contains:
(c2-1) an organohydrogenpolysiloxane having at least two silicon-bonded hydrogen atoms in the molecule and (c2-2) a hydrosilylation reaction catalyst, where the content of the (c2-1) organohydrogenpolysiloxane is an amount where the molar ratio of the silicon-bonded hydrogen atoms in the organohydrogenpolysiloxane relative to the curing reactive functional groups containing the carbon-carbon double bonds in component (A) and component (B) is in the range of 0.5 to 20.

6. The curable silicone composition according to claim 2, wherein component (D) is selected from the group consisting of a reinforcing filler, a white pigment, a thermally conductive filler, an electrically conductive filler, and an organic filler.

7. The curable silicone composition according to claim 1, in a granular, pellet, or sheet form.

8. A substantially flat, 10 to 1000 μm thick, curable silicone composition sheet formed from the curable silicone composition according to claim 1.

9. A film-like adhesive, comprising the curable silicone composition sheet according to claim 8.

10. A peelable laminate, comprising:
- the curable silicone composition sheet according to claim 8, and
- a sheet-like substrate with a release surface facing the curable silicone composition sheet on one or both surfaces of the curable silicone composition sheet.

11. A cured product obtained by curing the curable silicone composition according to claim 1.

12. A member for a semiconductor device or for an optical semiconductor device, the member comprising the cured product of claim 11.

13. A semiconductor device or an optical semiconductor device, having the cured product according to claim 11.

14. A method for manufacturing the curable silicone composition according to claim 1, wherein each component that makes up the curable silicone composition is granulated by mixing under temperature conditions not exceeding 50° C.

15. A method of molding a cured product, comprising the following steps:
- (I) heating and melting the curable silicone composition according to claim 1 at a temperature of 50° C. or higher;
- (II) injecting the curable silicone composition in a liquid state obtained in step (I) into a mold or distributing the curable silicone composition in a liquid state obtained in step (I) to a mold; and
- (III) curing the curable silicone composition injected or distributed in step (II).

* * * * *